(12) United States Patent
Komeda et al.

(10) Patent No.: US 10,998,488 B2
(45) Date of Patent: May 4, 2021

(54) PIEZOELECTRIC STACK

(71) Applicants: Nippon Valqua Industries, Ltd., Tokyo (JP); A School Corporation Kansai University, Osaka (JP)

(72) Inventors: Tetsuya Komeda, Gojo (JP); Yuki Yamanaka, Gojo (JP); Yoshiro Tajitsu, Suita (JP)

(73) Assignees: Valqua, Ltd., Tokyo (JP); A School Corporation Kansai University, Osaka (JP)

( * ) Notice: Subject to any disclaimer, the term of this patent is extended or adjusted under 35 U.S.C. 154(b) by 0 days.

(21) Appl. No.: 14/439,394

(22) PCT Filed: Oct. 29, 2013

(86) PCT No.: PCT/JP2013/079309
§ 371 (c)(1),
(2) Date: Apr. 29, 2015

(87) PCT Pub. No.: WO2014/069477
PCT Pub. Date: May 8, 2014

(65) Prior Publication Data
US 2015/0295163 A1 Oct. 15, 2015

(30) Foreign Application Priority Data

Oct. 31, 2012 (JP) ................................ 2012-240411
Feb. 15, 2013 (JP) ................................ 2013-027856
Jul. 10, 2013 (JP) ................................ 2013-144507

(51) Int. Cl.
*H01L 41/193* (2006.01)
*D06N 3/04* (2006.01)
(Continued)

(52) U.S. Cl.
CPC ......... *H01L 41/193* (2013.01); *D06N 3/0006* (2013.01); *D06N 3/0011* (2013.01);
(Continued)

(58) Field of Classification Search
CPC ........... H01L 41/193; D06N 3/00; D06N 3/04
(Continued)

(56) References Cited

U.S. PATENT DOCUMENTS 7,616,428 B2  11/2009  Kobayashi et al.
8,512,610 B2   8/2013  Okada et al.
(Continued)

FOREIGN PATENT DOCUMENTS

CN      1946891 A    4/2007
CN    101006211 A    7/2007
(Continued)

OTHER PUBLICATIONS

Machine English Translation_JP_2012164735_A1; Sugawara, J.; Fluororesin Film Piezoelectric Element; Aug. 30, 2012; EPO; whole document.*
(Continued)

*Primary Examiner* — Tahseen Khan
(74) *Attorney, Agent, or Firm* — The Webb Law Firm

(57) ABSTRACT

A piezoelectric stack includes a porous resin sheet, and a surface coating layer disposed on an exterior surface of the porous resin sheet, the exterior surface including at least one of a front surface and a back surface of the porous resin sheet, the surface coating layer having a volume resistivity of not less than $1\times10^{13}$ Ω·cm, the porous resin sheet and the surface coating layer having different elastic moduli.

9 Claims, 7 Drawing Sheets

(51) Int. Cl.
*D06N 3/00* (2006.01)
*H01G 7/02* (2006.01)
*H01L 41/45* (2013.01)
*H01L 41/053* (2006.01)

(52) U.S. Cl.
CPC ........... *D06N 3/0056* (2013.01); *D06N 3/047* (2013.01); *H01G 7/02* (2013.01); *H01G 7/028* (2013.01); *H01L 41/0533* (2013.01); *H01L 41/45* (2013.01); *D06N 2201/029* (2013.01); *D06N 2203/044* (2013.01); *D06N 2205/20* (2013.01); *D06N 2209/04* (2013.01); *D06N 2213/02* (2013.01)

(58) Field of Classification Search
USPC .......................................................... 428/212
See application file for complete search history.

(56) References Cited

U.S. PATENT DOCUMENTS

| | | | |
|---|---|---|---|
| 9,932,239 | B2 | 4/2018 | Nakatani et al. |
| 2006/0003152 | A1* | 1/2006 | Youngs .................... H01B 1/22 428/212 |
| 2007/0247785 | A1* | 10/2007 | Kobayashi ............... H01G 9/02 361/502 |
| 2008/0070037 | A1 | 3/2008 | Nonokawa et al. |
| 2008/0087047 | A1 | 4/2008 | Bayindir et al. |
| 2010/0130891 | A1* | 5/2010 | Taggart .................... A61N 7/00 601/2 |
| 2010/0193999 | A1 | 8/2010 | Anneaux et al. |
| 2011/0300388 | A1* | 12/2011 | Yokota ................ B29C 45/0005 428/422 |
| 2012/0177907 | A1 | 7/2012 | Koike et al. |
| 2013/0017450 | A1* | 1/2013 | Nakatani .................... B32B 5/26 429/247 |
| 2013/0109264 | A1 | 5/2013 | Kobayashi et al. |
| 2014/0157558 | A1* | 6/2014 | Chen ....................... H01L 41/25 29/25.35 |
| 2015/0015120 | A1* | 1/2015 | Kaimori ................... H01L 41/45 310/363 |

FOREIGN PATENT DOCUMENTS

| | | | | |
|---|---|---|---|---|
| CN | 101053048 | A | | 10/2007 |
| CN | 101705059 | A | | 5/2010 |
| CN | 102630198 | A | | 8/2012 |
| CN | 102892935 | A | | 1/2013 |
| JP | 03-097993 | A | | 4/1991 |
| JP | 2000273762 | A | * | 10/2000 |
| JP | 2002-203996 | | | 7/2002 |
| JP | 2003-224315 | | | 8/2003 |
| JP | 2009248497 | A | * | 10/2009 |
| JP | 2010-080743 | | | 4/2010 |
| JP | 2010089494 | A | | 4/2010 |
| JP | 2010-267906 | | | 11/2010 |
| JP | 2010-267906 | A | | 11/2010 |
| JP | 2011-210865 | A | | 10/2011 |
| JP | 2012-054459 | A | | 3/2012 |
| JP | 2012-515850 | A | | 7/2012 |
| JP | 2012-164735 | A | | 8/2012 |
| JP | 2012164735 | A1 | * | 8/2012 |
| WO | 2011/135801 | A1 | | 11/2011 |
| WO | WO-2011135801 | A1 | * | 11/2011 ............... B32B 5/26 |
| WO | WO-2012006338 | A2 | * | 1/2012 ............. D04H 1/732 |
| WO | WO 2012068764 | A1 | * | 5/2012 ............. H01L 41/25 |
| WO | WO 2013118598 | A1 | * | 8/2013 ............. H01L 41/45 |

OTHER PUBLICATIONS

Machine_English_translation_JP_2009248497_A1; Tarao, T.; Composite Sheet and Method for Manufacturing the same; Oct. 29, 2009; EPO; whole document (Year: 2009).*

Machine_English_translation_JP_2000273762_A1; Motogami, T.; Base Fabric for electromagnetic wave-shielding material; Oct. 3, 2000; EPO; whole document (Year: 2000).*

"Sen-i Binran (Genryou Hen) (Fiber Handbook (Raw Materials))", 1968, The Society of Fiber Science and Technology Japan, Maruzen Co., Ltd.

Tsuchida, Eishun, et al., Koubunshi (Polymers), 16, 347 (1967).

Liang Xi Dong et al., China Electrics Engineering Guide, Jan. 31, 2009, pp. 489-493, vol. 1.

* cited by examiner

[FIG. 1]
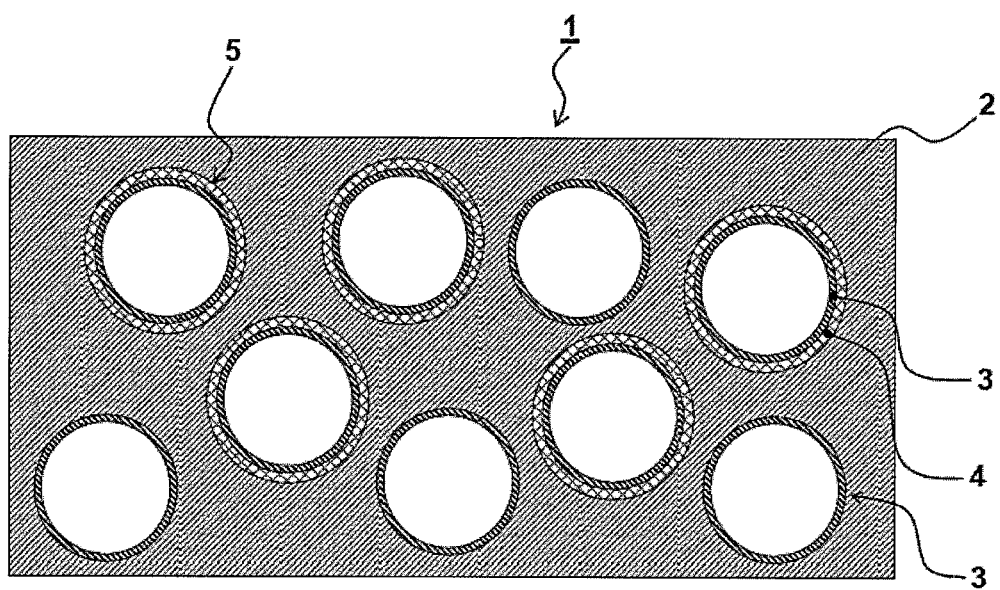

[FIG. 2]
(A)
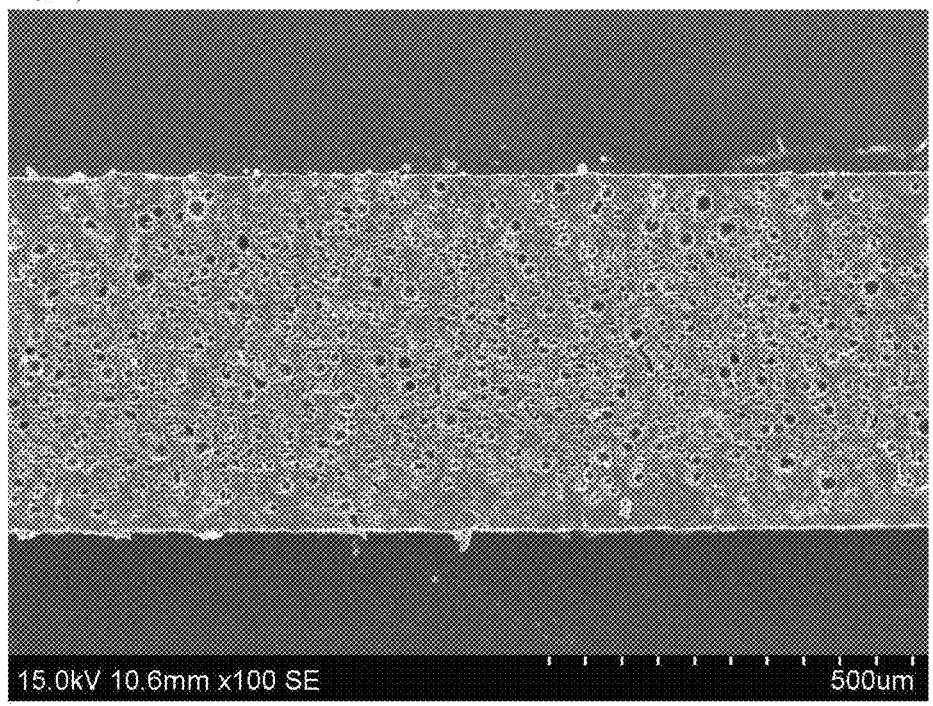
(B)
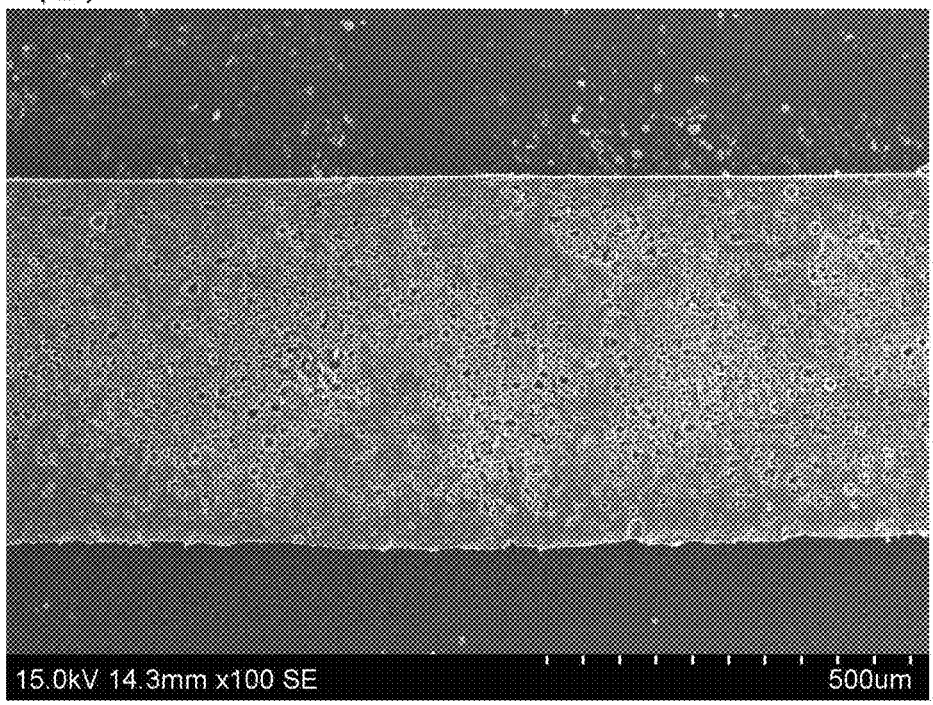

[FIG. 3]
(A)
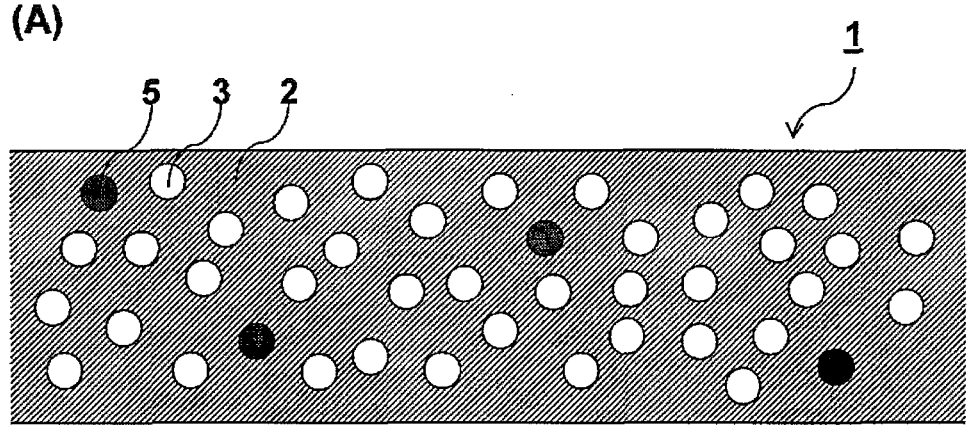
(B)
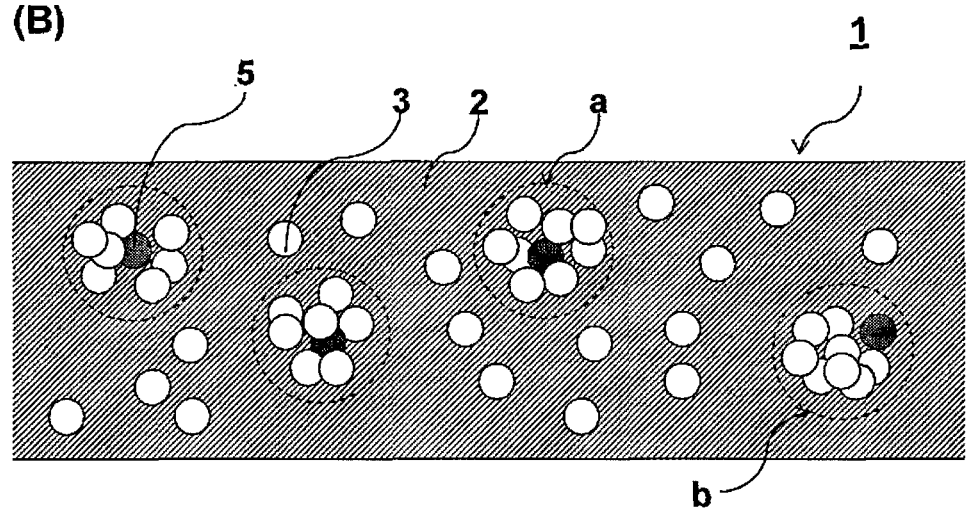

[FIG. 4]

| METHODS FOR PRODUCING POROUS RESIN SHEETS OF INVENTION ||||||
|---|---|---|---|---|---|
| "ANTERIOR CARBONIZATION METHOD" || "POSTERIOR CARBONIZATION METHOD" || "DEPOSITION METHOD" ||
| STEP (1a) | SURFACE OF HOLLOW PARTICLES COATED WITH SURFACE-TREATING AGENT ↓ HEAT TREATMENT (CARBONIZATION) ↓ CONDUCTIVE SUBSTANCE FORMED | STEP (1b) | SURFACE OF HOLLOW PARTICLES COATED WITH SURFACE-TREATING AGENT | STEP (1c) | CONDUCTIVE MATERIAL DEPOSITED ON SURFACE OF HOLLOW PARTICLES ↓ CONDUCTIVE SUBSTANCE FORMED |
| STEP (2) | HOLLOW PARTICLES WITH CONDUCTIVE SUBSTANCE MELT KNEADED WITH MATRIX RESIN ↓ KNEADED PRODUCT HEATED AND FORMED INTO SHEET | STEP (2') | HOLLOW PARTICLES WITH SURFACE-TREATING AGENT AND SO ON MELT KNEADED WITH MATRIX RESIN ↓ KNEADED PRODUCT HEATED AND FORMED INTO SHEET (CARBONIZATION ⇒ CONDUCTIVE SUBSTANCE FORMED ON HOLLOW PARTICLES) | STEP (2) | |
| STEP (3) | POLARIZATION TREATMENT (CHARGES INJECTED INTO SHEETS) |||||

[FIG. 5]
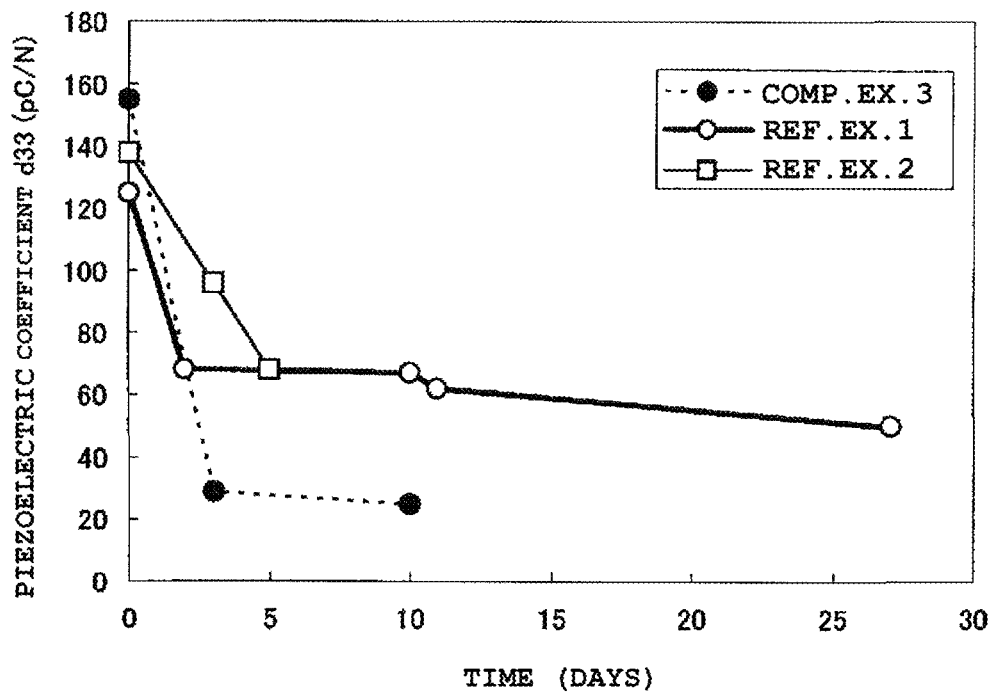
[FIG. 6]
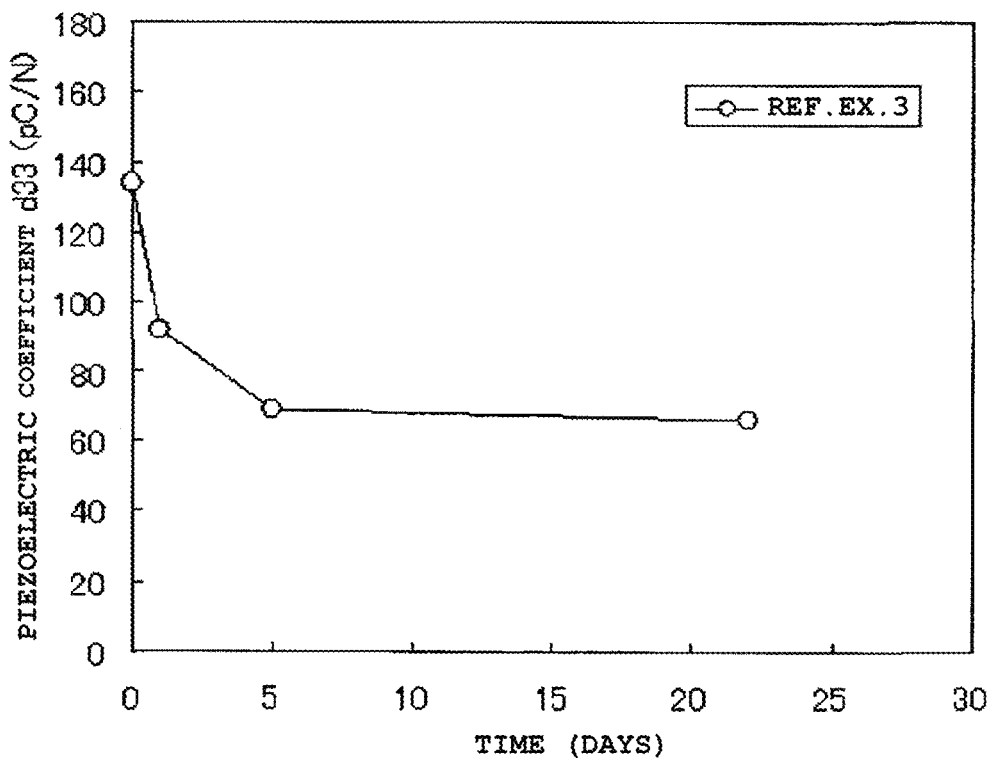

[FIG. 7]
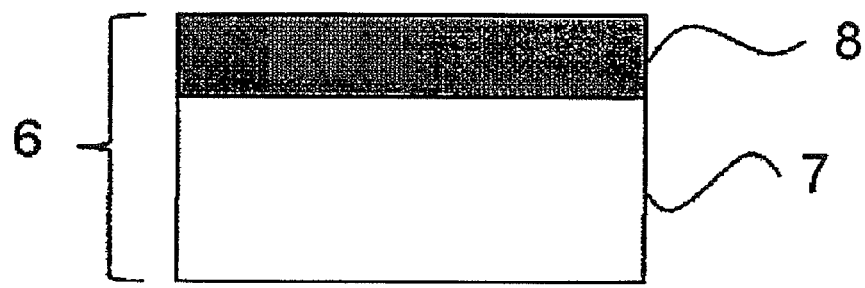
[FIG. 8]
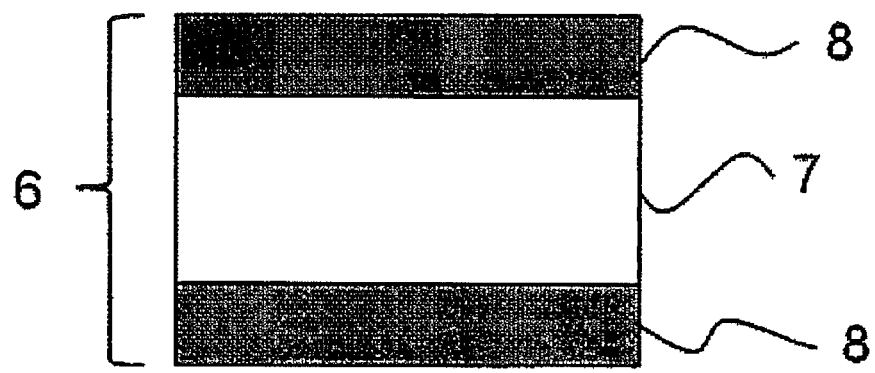
[FIG. 9]
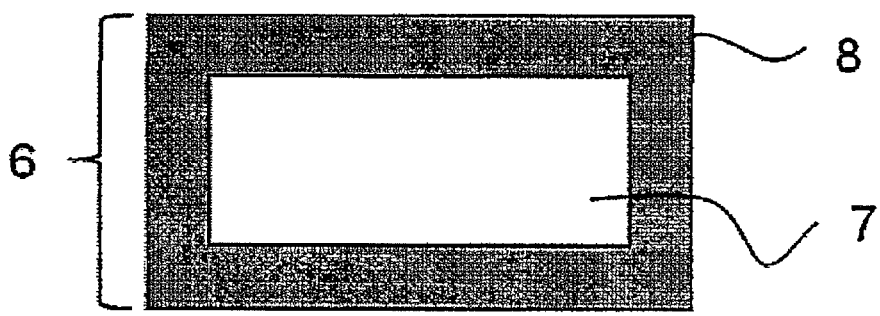

[FIG. 10]
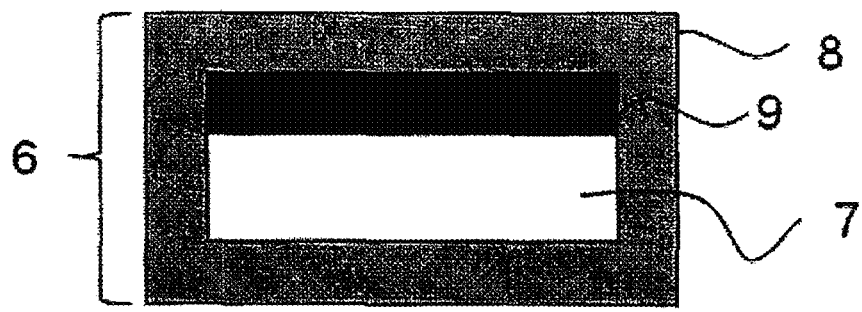
[FIG. 11]
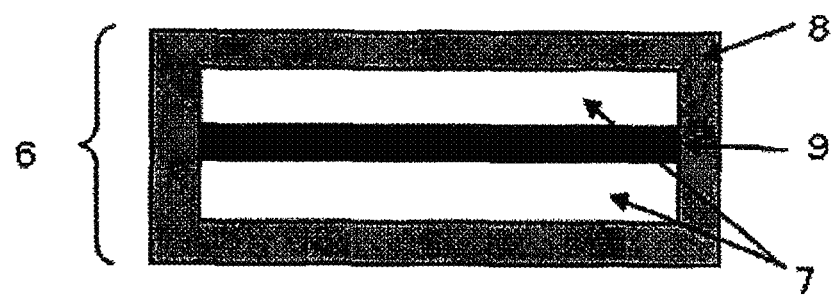
[FIG. 12]
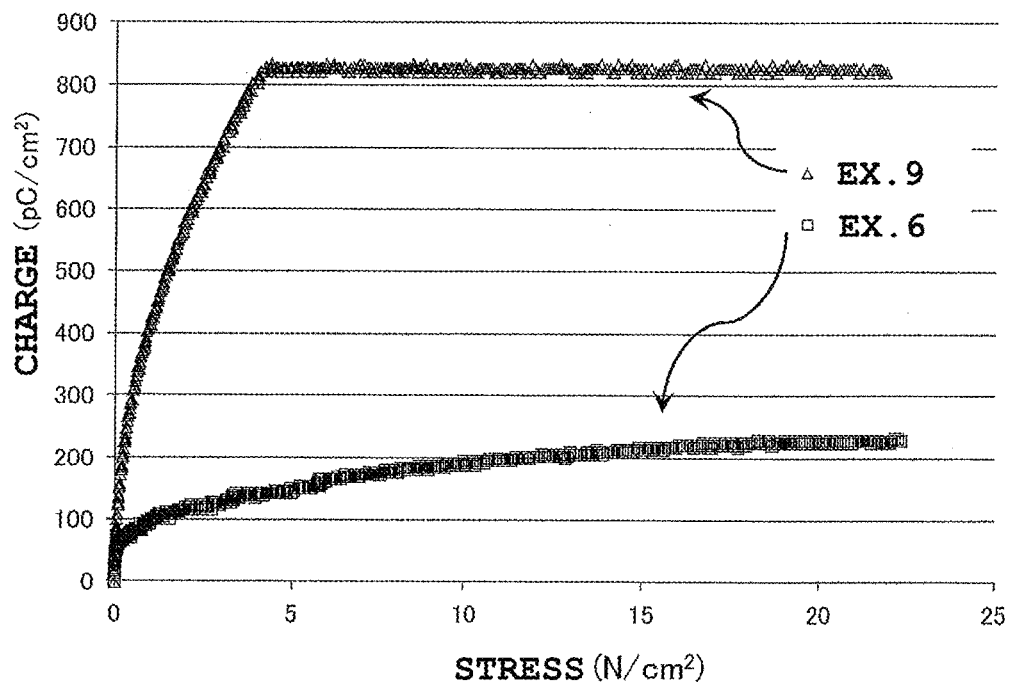

PIEZOELECTRIC STACK

CROSS-REFERENCE TO RELATED APPLICATIONS

This application is the United States national phase of International Application No. PCT/JP2013/079309 filed Oct. 29, 2013, and claims priority to Japanese Patent Application Nos. 2012-240411, 2013-027856, 2013-144507 filed Oct. 31, 2012, Feb. 15, 2013, Jul. 10, 2013, the disclosures of which are hereby incorporated in their entirety by reference.

TECHNICAL FIELD

The present invention relates to a piezoelectric stack having a surface coating layer with at least a specific value of volume resistivity on at least one surface of a porous resin sheet, and to a piezoelectric sheet for use in the piezoelectric stack.

BACKGROUND ART

Piezoelectric materials using porous organic materials (porous organic piezoelectric materials) have been studied. For example, Emfit Ltd. (Finland) has offered piezoelectric sheets using a porous polypropylene material.

The structure of this sheet is such that independent voids are uniformly distributed throughout the sheet. The sheet has a problem in that the piezoelectric coefficient is gradually decreased with time. The decrease is probably ascribed to gradual electric neutralization or attenuation of polarized charges stored in adjacent porous structures.

Some mechanisms are assumed to be the cause of the decay of charges in porous organic piezoelectric materials. One is such that polarized charges stored in porous structures are brought close to each other and cancel each other due to thermal motions or physical deformations of the organic materials. In other cases, charges themselves are lost by the accidental formation of conductive paths that connect the charges to an exterior environment.

Patent Literature 1 discloses a polymer porous electret in which conductive layers are disposed on the front and back sides of an organic polymer porous medium and an insulating material is disposed on at least one of the front and back conductive layers.

Patent Literature 2 discloses an electret film including a porous core layer and an insulating surface layer disposed on at least one side of the core layer.

Patent Literature 3 discloses a stack sheet including an insulating plate on at least one side of a porous resin sheet.

Patent Literature 4 discloses a stack which includes a cover layer with a specific capacitance index stacked on one or both sides of a porous resin sheet.

Patent Literature 5 discloses a stack film which includes a nonporous fluororesin thin film joined to one or both surfaces of a porous fluororesin film.

However, Patent Literatures 1 to 5 do not consider a difference in elastic modulus between the porous resin sheet and the layer stacked thereon.

CITATION LIST

Patent Literature

Patent Literature 1: JP-A-2010-267906
Patent Literature 2: JP-A-2010-089494
Patent Literature 3: JP-A-2011-210865
Patent Literature 4: JP-A-2012-054459
Patent Literature 5: JP-A-2012-164735

The conventional piezoelectric materials are still to be improved in terms of charge retention over a long time and the ability to maintain a high piezoelectric coefficient.

An object of the invention is to provide piezoelectric stacks and piezoelectric sheets that can store polarized charges within a porous structure over a long time and can maintain a high piezoelectric coefficient.

SUMMARY OF THE INVENTION

For example, the invention resides in the following [1] to [19].

[1]
A piezoelectric stack comprising:
a porous resin sheet, and
a surface coating layer disposed on an exterior surface of the porous resin sheet, the exterior surface including at least one of a front surface and a back surface of the porous resin sheet,
the surface coating layer having a volume resistivity of not less than $1 \times 10^{13}$ Ω·cm, the porous resin sheet and the surface coating layer having different elastic moduli.

[2]
The piezoelectric stack described in [1], wherein the difference in elastic modulus between the porous resin sheet and the surface coating layer is not less than 10 MPa.

[3]
The piezoelectric stack described in [1] or [2], wherein the surface coating layer has a relative dielectric constant of 2 to 100.

[4]
The piezoelectric stack described in any of [1] to [3], wherein the surface coating layer covers the front and back surfaces and end surfaces of the porous resin sheet.

[5]
The piezoelectric stack described in any of [1] to [4], wherein
the porous resin sheet comprises at least a matrix resin and charge-inducible hollow particles dispersed in the matrix resin,
the charge-inducible hollow particles comprise hollow particles and a conductive substance attached to at least a portion of the surface of the hollow particles, and
the conductive substance has a higher conductivity than the hollow particles and the matrix resin.

[6]
The piezoelectric stack described in any of [1] to [4], wherein the porous resin sheet is a piezoelectric sheet comprising a nonwoven fabric or a woven fabric formed of fibers comprising an organic polymer.

[7]
The piezoelectric stack described in [6], wherein the average fiber diameter of the fibers is 0.05 to 50 μm and the coefficient of variation of the fiber diameters is not more than 0.7.

[8]
The piezoelectric stack described in [6] or [7], wherein the piezoelectric sheet has a porosity of not less than 60%.

[9]
The piezoelectric stack described in any of [6] to [8], wherein the organic polymer is an organic polymer free from a molecular dipole or a crystal dipole.

[10]
The piezoelectric stack described in any of [6] to [9], wherein the organic polymer is polytetrafluoroethylene.

[11]
A piezoelectric sheet comprising a nonwoven fabric or a woven fabric formed of fibers comprising an organic polymer.

[12]
The piezoelectric sheet described in [11], wherein the average fiber diameter of the fibers is 0.05 to 50 μm and the coefficient of variation of the fiber diameters is not more than 0.7.

[13]
The piezoelectric sheet described in [11] or [12], wherein the piezoelectric sheet has a porosity of not less than 60%.

[14]
The piezoelectric sheet described in any of [11] to [13], wherein the organic polymer is an organic polymer free from a molecular dipole or a crystal dipole.

[15]
The piezoelectric sheet described in any of [11] to [14], wherein the organic polymer is polytetrafluoroethylene.

[16]
A piezoelectric sheet comprising a nonwoven fabric or a woven fabric formed of fibers comprising an inorganic material, the piezoelectric sheet having a porosity of not less than 60%.

[17]
The piezoelectric sheet described in [16], wherein the average fiber diameter of the fibers is 0.05 to 50 μm and the coefficient of variation of the fiber diameters is not more than 0.7.

[18]
A piezoelectric stack comprising:
the piezoelectric sheet described in [16] or [17], and
a surface coating layer disposed on an exterior surface of the piezoelectric sheet, the exterior surface including at least one of a front surface and a back surface of the piezoelectric sheet,
the surface coating layer having a volume resistivity of not less than $1 \times 10^{13}$ Ω·cm, the piezoelectric sheet and the surface coating layer having different elastic moduli.

[19]
The piezoelectric stack described in [18], wherein the surface coating layer is disposed on the front and back surfaces and end surfaces of the piezoelectric sheet.

The piezoelectric stacks and the piezoelectric sheets provided according to the invention can store polarized charges within the porous structure over a long time and can maintain a high piezoelectric coefficient.

In the invention, specifically, a surface coating layer having a specific volume resistivity is stacked on at least one of a front surface and a back surface of a porous resin sheet. This configuration isolates the charges stored in the porous resin sheet from electrical connection to an exterior environment and thus prevents the charges from attenuation, thereby effectively realizing the retention of piezoelectric coefficient.

Further, the porous resin sheet and the surface coating layer constituting the piezoelectric stack of the invention have different elastic moduli. This configuration induces a nonlinear deformation in response to a compressive strain in case of extraction of the charges, and allows the piezoelectric stack to exhibit a high piezoelectric coefficient.

The piezoelectric sheet in an aspect of the invention includes a nonwoven fabric or a woven fabric formed of organic polymer fibers. With this configuration, the piezoelectric sheet has a high porosity and excellent charge retention characteristics and, in particular, can store a large amount of charges.

The piezoelectric sheet in an aspect of the invention includes a nonwoven fabric or a woven fabric formed of inorganic material fibers, and has a porosity of not less than 60%. With this configuration, the piezoelectric sheet exhibits excellent flexibility and a high piezoelectric coefficient.

BRIEF DESCRIPTION OF DRAWINGS

FIG. 1 is a schematic view illustrating an example of a cross section of a porous resin sheet 1 used in the invention, in which charge-inducible hollow particles 5 (including hollow particles 3 and a conductive substance 4 attached to the surface) and hollow particles 3 are dispersed in a matrix resin 2.

FIG. 2(A) is a cross sectional SEM image of a porous resin sheet obtained in Reference Example 1, and FIG. 2(B) is a cross sectional SEM image of a porous resin sheet obtained in Reference Example 3. FIGS. 2(A) and 2(B) illustrate different forms of dispersion of particles (charge-inducible hollow particles 5 and/or hollow particles 3).

FIG. 3(A) is a view illustrating a uniform dispersion model, and FIG. 3(B) is a view showing a sea-island structure model. In FIG. 3(B), the dotted line circles indicate island structures having a high void rate due to a high content of charge-inducible hollow particles 5 and/or hollow particles 3.

FIG. 4 is a flow chart showing examples of methods for producing porous resin sheets used in the invention.

FIG. 5 is a graph plotting the piezoelectric coefficient $d_{33}$ (pC/N) versus time of porous resin sheets obtained in Comparative Example 3 and Reference Examples 1 and 2.

FIG. 6 is a graph plotting the piezoelectric coefficient $d_{33}$ (pC/N) versus time of a porous resin sheet obtained in Reference Example 3.

FIG. 7 is a schematic sectional view illustrating an example of piezoelectric stacks of the invention.

FIG. 8 is a schematic sectional view illustrating an example of piezoelectric stacks of the invention.

FIG. 9 is a schematic sectional view illustrating an example of piezoelectric stacks of the invention.

FIG. 10 is a schematic sectional view illustrating an example of piezoelectric stacks of the invention.

FIG. 11 is a schematic sectional view illustrating an example of piezoelectric stacks of the invention.

FIG. 12 illustrates results of the evaluation of charge response of piezoelectric stacks obtained in Examples 6 and 9.

DESCRIPTION OF EMBODIMENTS

Hereinbelow, piezoelectric stacks and other aspects of the present invention will be described in greater detail.

A piezoelectric stack of the invention includes:
a porous resin sheet, and a surface coating layer disposed on an exterior surface of the porous resin sheet, the exterior surface including at least one of a front surface and a back surface of the porous resin sheet; or
a piezoelectric sheet which includes a nonwoven fabric or a woven fabric formed of inorganic material fibers and has a porosity of not less than 60%, and a surface coating layer disposed on an exterior surface of the piezoelectric sheet, the exterior surface including at least one of a front surface and a back surface of the piezoelectric sheet.

The surface coating layer has a volume resistivity of not less than $1\times10^{13}$ Ω·cm, and the porous resin sheet or the piezoelectric sheet has a different elastic modulus from the surface coating layer.

[1. Porous Resin Sheets]

The porous resin sheets used in the invention are preferably those sheets which are formed of organic materials capable of storing charges. Examples of the porous resin sheets made of such organic materials include porous resin sheets of a mixture including a matrix resin and at least charge-inducible hollow particles, foamed sheets of organic polymers, nonwoven fabrics or woven fabrics of organic polymers, and stretched (expanded) porous films of organic polymers. Another example is sheets formed by a method in which a phase separating material dispersed in an organic polymer is removed with an extracting agent such as supercritical carbon dioxide so as to form pores.

The thickness of the porous resin sheets is usually 10 μm to 1 mm, and preferably 50 μm to 500 μm.

Examples of the organic polymers as raw materials for the foams include polyurethane resins, polystyrene resins, vinyl acetate resins, polyethylene terephthalate resins, phenolic resins, silicone resins, polyvinyl chloride resins, urea resins, acrylic resins, polyimide resins, fluororesins and ethylenepropylene resins.

Examples of the organic polymers as raw materials for the nonwoven fabrics and the woven fabrics include those polymers which have a volume resistivity of not less than $1.0\times10^{15}$ Ω·cm, with specific examples including polyamide resins (such as 6-nylon and 6,6-nylon), aromatic polyamide resins (such as aramid), polyolefin resins (such as polyethylene and polypropylene), polyester resins (such as polyethylene terephthalate), polyacrylonitriles, phenolic resins, fluororesins (such as polytetrafluoroethylene and polyvinylidene fluoride) and imide resins (such as polyimide, polyamideimide and bismaleimide).

From viewpoints such as heat resistance and weather resistance, the polymers are preferably organic polymers which have a high continuous service temperature and are free from a molecular dipole or a crystal dipole, or organic polymers whose glass transition temperature is outside the range of service temperatures of the piezoelectric stacks. The continuous service temperature may be measured by a continuous service temperature test specified in UL746B (UL standards), and is preferably not less than 100° C., and more preferably not less than 200° C. From the viewpoint of moisture proofness, water-repellent organic polymers are preferable. Preferred examples of such organic polymers include polyolefin resins, imide resins and fluororesins, with polytetrafluoroethylene (PTFE) being more preferable.

Examples of the organic polymers as raw materials for the stretched porous films include polyethylene, polypropylene, polyvinylidene fluoride and polytetrafluoroethylene.

In order to ensure that a high piezoelectric coefficient is maintained over a long period of time, the porous resin sheets used in the invention are preferably sheets that are formed of a mixture including a matrix resin and at least charge-inducible hollow particles. To ensure durability and long-term deformation performance, it is preferable to use porous resin sheets that include nonwoven fabrics formed of organic polymers, and it is more preferable to use piezoelectric sheets that include nonwoven fabrics formed of organic polymer fibers.

(Porous Resin Sheets Formed of a Mixture Including a Matrix Resin and at Least Charge-Inducible Hollow Particles)

The porous resin sheets which are formed of a mixture including a matrix resin and at least charge-inducible hollow particles will be discussed. For example, the porous resin sheets are formed of a mixture in which at least charge-inducible hollow particles are dispersed in a matrix resin. The charge-inducible hollow particles are preferably such that a conductive substance is attached on at least a portion of the surface of hollow particles and the conductive substance preferably has a higher conductivity than the hollow particles and the matrix resin.

The initial value of the piezoelectric coefficient $d_{33}$ of the porous resin sheets (immediately after the porous resin sheets are produced) is preferably not less than 110 pC/N, and more preferably about 115 to 160 pC/N. The piezoelectric coefficient $d_{33}$ after 5 days from the production of resin sheets 1 is preferably not less than 60 pC/N, and more preferably not less than 70 pC/N. The piezoelectric coefficient $d_{33}$ after the passage of 25 days is preferably not less than 50 pC/N.

An example of such porous resin sheets is illustrated in FIG. 1.

Referring to FIG. 1, a porous resin sheet (hereinafter, also written simply as "resin sheet") 1 is such that hollow particles without the attachment of a conductive substance 4 (hereinafter, also written simply as "conductive substance-free particles") 3 and charge-inducible hollow particles 5 are dispersed in a matrix resin 2. The resin sheet 1 may be such that there are no conductive substance-free particles 3 in the resin sheet 1 (such a configuration is not illustrated).

The charge-inducible hollow particles include hollow particles and a conductive substance attached to the surface (the entire surface or a portion of the surface) of the hollow particles. Preferably, the conductivity of the charge-inducible hollow particles and the conductive substance is higher than the conductivity of the matrix resin and the conductive substance-free particles.

Provided that the resin sheet 1 contains no conductive substance-free particles 3 and all the particles 3 in FIG. 1 are replaced by charge-inducible hollow particles 5 (the total number of the particles is unchanged), specifically, all the particles dispersed in the resin sheet 1 are charge-inducible hollow particles 5, it is assumed that the piezoelectric characteristics of such a resin sheet will be more or less enhanced at an initial stage (elapsed time=0 days) but will be markedly decayed over time, as compared to a resin sheet 1 containing both types of the particles 3 and the particles 5. The reason for this assumption is that a resin sheet containing only charge-inducible hollow particles 5 has a higher probability that the charge-inducible hollow particles 5 arranged along the thickness direction will be brought close to or in contact with each other to form "conductive paths", and consequently there is a high chance for the charges to escape from the resin sheet surface.

In contrast, the resin sheet 1 containing a combination or a mixture of the conductive substance-free particles 3 and the charge-inducible hollow particles 5 is advantageous in that such conductive paths made by the charge-inducible hollow particles 5 will be interrupted. The interruption of conductive paths leads to an enhancement in the charge retention rate of the resin sheet 1, and consequently high piezoelectric characteristics will be maintained over a long term.

Porous resin sheets were actually produced using mixtures of a matrix resin and at least charge-inducible hollow particles, and their cross sections were recorded with a scanning electron microscope (SEM). The SEM images are illustrated in FIGS. 2(A) and 2(B). The scanning electron microscope used for the recording was "S-3400" manufactured by Hitachi High-Technologies Corporation, and the magnification was 100 times.

Both of the resin sheets are considered to contain charge-inducible hollow particles 5 and conductive substance-free particles 3 in specific proportions, but these particles cannot be differentiated from each other on the images. The particles in the SEM image in FIG. 2(A) seem to be uniformly dispersed in the resin sheet, whereas it appears in the SEM image in FIG. 2 (B) that the particles have gathered into masses (islands) which are uniformly dispersed.

FIGS. 3(A) and 3(B) illustrate a uniform dispersion model and a sea-island structure model based on the SEM images of FIGS. 2(A) and 2(B), respectively. In FIG. 3(A), the charge-inducible hollow particles 5 and the conductive substance-free particles 3 are uniformly dispersed similarly to FIG. 1, whereas in FIG. 3(B), the conductive substance-free particles 3 and/or the charge-inducible hollow particles 5 are highly aggregated to form island structures "a" and "b" having a high void rate, and the island structures "a" and "b" are dispersed uniformly.

The island structures resulting from the aggregation of the conductive substance-free particles 3 and/or the charge-inducible hollow particles 5 are typically structures "a" and "b" indicated with the dotted line circles in FIG. 3(B). The island "a" has the particle 5 as the core and the particles 3 that surround the core. The island "b" has the particle 5 not as the core but on the outermost layer of the island. Of these types of the islands, the islands "a" are preferable.

The islands illustrated in FIG. 3(B) may be considered as quasi large hollow particles.

The distance between adjacent islands (large hollow particles) in FIG. 3(B) is longer than the distance between adjacent charge-inducible hollow particles 5 in FIG. 3(A). Consequently, it is difficult for the charge-inducible hollow particles 5 to form a conductive path to the surface of the resin sheet. In particular, the resin sheet 1 containing the islands "a" has a particularly low probability of the formation of conductive paths because the conductive substance-free particles 3 present around the charge-inducible hollow particles 5 interrupt the conductive paths, resulting in an increase in the charge retention rate of the resin sheet 1. It is therefore assumed that the decay with time of piezoelectric characteristics is slower in the sea-island structure model illustrated in FIG. 3(B) than in the uniform dispersion model shown in FIG. 3(A), and hence high piezoelectric characteristics may be maintained over a long term.

The model in FIG. 3 (B) will be discussed in further detail below.

The sea-island structure may take other forms such as one composed of a sea structure with a low void rate (namely, a region with a low content of particles 3 and/or particles 5) and island structures with a high void rate (namely, regions with a high content of particles 3 and/or particles 5). The island structures with a high void rate exhibit a high piezoelectric coefficient, and the sea with a low void rate reduces a decrease in piezoelectric coefficient by preventing physical access between the polarized charges. The use of a resin sheet 1 having such a sea-island structure, namely, the nonuniform dispersion of particles 3 and/or particles 5 in the sheet presumably makes it possible to achieve a high piezoelectric coefficient and also to maintain piezoelectric characteristics over a long term.

(Charge-Inducible Hollow Particles 5)

The charge-inducible hollow particles 5 used in the resin sheet 1 are such that a conductive substance 4 is attached to at least a portion or the entirety of the surface of hollow particles.

For example, such charge-inducible hollow particles 5 may be obtained by attaching or depositing a conductive substance 4 onto at least a portion of the surface of hollow particles. When the hollow particles are particles which have a carbon-containing substance attached on at least a portion of the surface of the particles (hereinafter, also written as "surface-treated particles"), the charge-inducible hollow particles may be obtained by heat treating the surface-treated particles under such conditions that the carbon-containing substance will be carbonized. Specifically, the charge-inducible hollow particles may be obtained by a step (1a) in an "anterior carbonization method", a step (2') in a "posterior carbonization method", or a step (1c) in a "deposition method" described later.

(Conductive Substance-Free Particles 3)

The conductive substance-free particles 3 have a closed cell, namely, an inside space isolated from the outside, and are preferably resistant to structural breakage when the particles are melt kneaded with a matrix resin 2. Examples of such hollow particles include glass particles, ceramic particles and organic polymer particles. Hollow particles of insulating materials are preferable. The inside of the particles 3 may be in a vacuum or normal pressure in accordance with the application of the obtainable sheets. When the inside is in normal pressure, the particles are frequently filled with a gas such as air.

The particles 3 may be any hollow particles which do not have a conductive substance attached on the surface thereof. That is, any of the aforementioned particles such as glass particles may be used as such (untreated particles), or a precursor such as a carbon-containing substance may be attached on the surface of the particles.

Examples of the glass hollow particles include hollow particles of soda lime glass, soda lime borosilicate glass, borosilicate glass, sodium borosilicate glass, sodium silicate glass and aluminosilicate glass.

The glass content in the glass hollow particles is preferably 10 to 30 vol %. A 10 vol % or higher glass content ensures sufficient mechanical strength, and the hollow particles exhibit a resistance to breakage during the resin sheet production steps and can maintain the void structure. With the content being 30 vol % or below, a sufficient porosity may be ensured.

Examples of the ceramic hollow particles include alumina hollow particles.

Examples of the organic polymer hollow particles include expanded organic polymer hollow particles and thermally-expandable organic polymer hollow particles. Examples of the expanded organic polymers include crosslinked styrene acrylic polymers and acrylonitrile polymers. Examples of the thermally-expandable organic polymers include acrylonitrile polymers.

The size of the conductive substance-free particles 3 is not particularly limited. However, it is preferable to use particles having a 50% particle diameter (a median diameter) of 1 to 100 μm for reasons such as that high piezoelectric characteristics and high charge retention rate may be obtained and that the mechanical strength of the resin sheets themselves may be ensured. The particle diameter of the hollow particles may be measured based on a dynamic light scattering method.

The closed cell structure of the conductive substance-free particles 3 allows the resin sheet to exhibit constant elasticity over a long term even when the resin sheet is subjected to a continuous external stress, and causes substantially no decrease in piezoelectric characteristics of the resin sheet.

(Conductive Substances 4)

The conductive substance 4 is attached to a portion or the entirety of the surface of the hollow particles, and serves to store charges in the resin sheet. The conductive substance 4 preferably has a higher conductivity than the conductive substance-free particles 3 and the matrix resin 2, and more preferably has a conductivity of not less than $1.0 \times 10^{-10}$ S/cm. The conductivity may be measured by a double-ring electrode method based on the conductivity of the conductive substance itself.

The presence of the conductive substance 4 on the surface of the hollow particles makes it possible to inject charges into the resin sheet 1 at a lower voltage when a polarization treatment described later is performed during the production of the resin sheet 1, and further makes it possible to maintain piezoelectric characteristics of the resin sheet 1 over an extended period of time. Further, the resin sheet 1 may exhibit a high initial piezoelectric value and long-term piezoelectric characteristics as a result of its containing the conductive substance-free particles 3 and the charge-inducible hollow particles 5 as illustrated in FIG. 1.

The conductive substance that is attached or deposited onto the hollow particles is preferably one or more selected from the group consisting of carbon, graphite, platinum, gold and indium tin oxide (ITO).

The conductive substance 4 may be a product that is obtained by heat treating the carbon-containing substance attached on the surface of the surface-treated particles under oxygen-free conditions, namely, in the matrix resin 2 (the treatment is assumed to result in the carbonization of the substance). For example, such a substance may be obtained by heat treating (carbonizing) the carbon-containing substance (at a temperature equal to or higher than the pyrolysis temperature of the substance, and usually in the range of from the melting point to less than the decomposition temperature of the matrix resin).

The carbon-containing substance subjected to the above heat treatment is preferably a substance containing a hydrocarbon group. For example, the hydrocarbon group-containing substance may be one or more selected from the group consisting of surfactants, silane-coupling agents, aluminate coupling agents and titanate coupling agents.

From viewpoints such as handling during the production of the charge-inducible hollow particles 5, the hydrocarbon group-containing substance desirably has a pyrolysis onset temperature of 100 to 300° C., and preferably 150 to 250° C. at normal pressure. More specifically, the pyrolysis onset temperature (the carbonization temperature) of the hydrocarbon group-containing substance is desirably a temperature lower than the pyrolysis temperature of the matrix resin 2 by 50° C. or more, and preferably by 100° C. or more in order to facilitate the temperature control during the heat treatment.

The surfactants will be discussed in detail. Examples of the surfactants include nonionic surfactants, amphoteric surfactants and cationic surfactants having a hydrocarbon group. The surfactant is pyrolyzed by being heated at or above the pyrolysis temperature of the surfactant in the matrix resin (oxygen-free conditions) to form a conductive substance (probably to be decomposed into carbon, water and amorphous surfactant pyrolysis products). Surfactants which are environmentally friendly and inexpensive are desirable, with examples including those described on the internet such as "http://www.ecosci.jp/sa/sa.html".

Examples of the nonionic surfactants include fatty acid diethanolamides {R—CON(CH$_2$CH$_2$OH)$_2$, R: C1-20 alkyl group, preferably alkyl group having about 5 to 15 carbon atoms} such as C$_{11}$H$_{23}$—CON(CH$_2$CH$_2$OH)$_2$; polyoxyethylene alkyl ethers (AE) [higher alcohols, R—O(CH$_2$CH$_2$O)$_n$H, R: alkyl group having about 1 to 20 carbon atoms, n: integer of about 1 to 30, preferably about 5 to 15] such as C$_{12}$H$_{25}$—O(CH$_2$CH$_2$O)$_8$H; and polyoxyethylene alkylphenyl ethers (APE) {(R—(C$_6$H$_4$)O(CH$_2$CH$_2$O)$_n$H, R: C1-20 alkyl group, preferably alkyl group having about 5 to 15 carbon atoms, n: integer of about 1 to 30, preferably about 5 to 15)} such as C$_8$H$_{18}$—(C$_6$H$_4$)O(CH$_2$CH$_2$O)$_8$H.

Examples of the amphoteric surfactants include alkylcarboxybetaines [betaine surfactants] {R—N$^+$(CH$_3$)$_2$.CH$_2$COO$^-$, R: alkyl group having about 1 to 20 carbon atoms, preferably about 5 to 15 carbon atoms} such as C$_{12}$H$_{25}$—N$^+$(CH$_3$)$_2$.CH$_2$COO$^-$.

Examples of the cationic surfactants include alkyltrimethylammonium salts {R—N$^+$(CH$_3$)$_3$.Cl$^-$, R: alkyl group having about 1 to 20 carbon atoms, preferably about 5 to 15 carbon atoms} such as C$_{12}$H$_{25}$—N$^+$(CH$_3$)$_3$.Cl$^-$; dialkyldimethylammonium chlorides {R$_2$—N$^+$(CH$_3$)$_2$.Cl$^-$, R: alkyl group having about 1 to 20 carbon atoms, preferably about 5 to 15 carbon atoms)} such as C$_{12}$H$_{25}$—N$^+$(C$_8$H$_{17}$)(CH$_3$)$_2$.Cl$^-$; and alkylpyridinium chlorides {R—(N$^+$C$_5$H$_5$).Cl$^-$, R: alkyl group having about 1 to 20 carbon atoms, preferably about 5 to 15 carbon atoms)} such as C$_{12}$H$_{25}$—(N$^+$C$_5$H$_5$).Cl$^-$.

Of these, the nonionic surfactants are preferable, and polyoxyethylene alkyl ethers are particularly preferable to reduce the charge decay of the porous resin sheets.

In addition to the hydrocarbon group-containing surfactants, examples of the surfactants as the carbon-containing substance further include fluorosurfactants which contain a perfluoroalkyl group and exhibit excellent properties such as wetting properties and permeation properties. Specific examples include perfluoroalkylsulfonic acids (CF$_3$(CF$_2$)$_n$SO$_3$H, n: repeating units) (PFOS), perfluoroalkylcarboxylic acids (CF$_3$(CF$_2$)$_n$COOH, n: repeating units) (PFOA), and fluorotelomer alcohols (F(CF$_2$)$_n$CH$_2$CH$_2$OH, n: repeating units).

For example, the nonionic surfactant may be preferably nonionic surfactant "Nonion ID-206" manufactured by NOF CORPORATION (pyrolysis onset temperature at normal pressure: 150° C.). The fluorosurfactant may be preferably a nonionic fluorosurfactant such as fluorosurfactant (SURFLON) "S-241" manufactured by AGC SEIMI CHEMICAL CO., LTD. (pyrolysis onset temperature at normal pressure: 220° C.) and "FTERGENT 251" manufactured by NEOS COMPANY LIMITED (pyrolysis onset temperature at normal pressure: 220° C.) or an anionic fluorosurfactant (for example, a commercial product of NEOS COMPANY LIMITED).

The amount of the surfactant attached is desirably about 0.1 to 5 wt % relative to 100 wt % of the weight of the hollow particles. This amount advantageously ensures that the charge-inducible hollow particles obtained by heat treatment of the surface of the hollow particles exhibit charge induction effects efficiently.

(Matrix Resins 2)

The matrix resin 2 is not particularly limited. Examples thereof include resins having a pyrolysis onset temperature of 150 to 450° C. Specific examples include thermoplastic resins including fluororesins such as tetrafluoroethylene-perfluoroalkyl vinyl ether copolymers [PFA] (for example, apparent density: 1.0 to 1.2 g/ml (in accordance with ASTM D2116)), tetrafluoroethylene-hexafluoropropylene copolymers [FEP] (for example, apparent density: 1.0 to 1.2 g/ml), polychlorotrifluoroethylene [PCTFE] (for example, apparent density: 0.9 to 1.2 g/ml), tetrafluoroethylene-ethylene copolymers [ETFE] (for example, apparent density: 1.0 to 1.2 g/ml), polyvinylidene fluoride [PVdF], polyvinyl fluoride [PVF], and tetrafluoroethylene-hexafluoropropylene-vinylidene fluoride copolymers [THV]; polyolefin resins such as polypropylene and polyethylene; vinyl polymers such as polystyrene, polymethyl methacrylate, poly(meth) acrylate esters, polyvinyl chloride and polyvinylidene chloride; polyester polymers such as polyethylene terephthalate, polybutylene terephthalate, polyethylene naphthalate, polylactic acid, polyhydroxyalkanoates, polybutylene succinate, polyethylene succinate and polyethylene succinate adipate; polyamide resins such as 6-nylon, 6,6-nylon, 11-nylon and 12-nylon; imide resins such as polyimide, polyamideimide, polyetherimide and bismaleimide; and engineering plastics such as polycarbonates and cycloolefins; and further include thermosetting resins such as unsaturated polyesters, vinyl ester resins, diallyl phthalate resins, epoxy resins, polyurethanes, silicon resins, alkyd resins, furan resins, cyclopentadiene resins, acrylic resins and allyl carbonate resins.

Of these matrix resins 2, the use of thermoplastic resins is preferable because of the easiness in uniformly dispersing the conductive substance-free particles 3 and/or the charge-inducible hollow particles 5.

From the viewpoint of electrification characteristics, the matrix resin 2 is preferably a material which has a different tendency to be charged and is as remote as possible in the triboelectric series from the hollow particles which tend to become positively charged. For example, fluororesins and imide resins are preferable. In the case where glass hollow particles are used as the conductive substance-free particles 3, the "material which is as remote as possible in the triboelectric series" as used in the specification may be a material such as a fluororesin which is listed on the more negative side in the triboelectric series than the glass hollow particles based on triboelectric tables disclosed in The Society of Fiber Science and Technology Japan, "Sen-i Binran (Genryou Hen) (Fiber Handbook (Raw Materials))", MARUZEN Co., Ltd. (1968), and Eishun TSUCHIDA and Takumi SHINOHARA, Koubunshi (Polymers), 16, 347 (1967).

From the viewpoint of heat resistance characteristics, the matrix resin 2 is preferably a resin having a high melting point and a high pyrolysis onset temperature. For example, fluororesins and imide resins are preferable.

In the case where the surface-treated particles as the hollow particles are mixed with the matrix resin 2 and are heat treated to form charge-inducible hollow particles, the matrix resin 2 is preferably a resin having a higher pyrolysis onset temperature than the minimum temperature required for the carbon-containing substance to be heat treated (probably carbonized) to achieve the desired conductive properties, namely, than the pyrolysis onset temperature of the carbon-containing substance (the temperature which causes a 5% decrease in the amount of the substance in thermogravimetry under air).

Of the matrix resins 2, those resins having a pyrolysis onset temperature of 150 to 450° C. are preferable, and those resins having a pyrolysis onset temperature of 300 to 450° C. are more preferable. For example, it is desirable to use fluororesins such as PFA (pyrolysis onset temperature: about 410° C.), FEP (pyrolysis onset temperature: about 400° C.), ETFE (pyrolysis onset temperature: about 360° C.) and PCTFE (pyrolysis onset temperature: about 340° C.), and imide resins such as polyimide (pyrolysis onset temperature: about 400° C.) and bismaleimide (pyrolysis onset temperature: about 400° C.)

The use of these fluororesins and imide resins is highly advantageous in that the obtainable resin sheets 1 show excellent heat resistance and weather resistance and exhibit excellent stability in piezoelectric characteristics over time at high temperatures, in particular, 80° C. or above.

(Methods for Producing Porous Resin Sheets 1)

The resin sheets 1 used in the invention may be produced by any methods without limitation. For example, any of an "anterior carbonization method", a "posterior carbonization method" and a "deposition method" illustrated in FIG. 4 may be used.

For example, the sea-island structure may be formed in the resin sheet 1 by adopting a "two-stage dispersion method" described later, in a step (2) in the anterior carbonization method or the deposition method or in a step (2') in the posterior carbonization method.

⟨Anterior Carbonization Method⟩

The anterior carbonization method includes:

Step (1a): The surface-treated particles are heat treated to pyrolyze the substance attached to the particles. The treatment causes part or the whole of the substance to obtain conductive properties (probably by carbonization), resulting in charge-inducible hollow particles in which the conductive substance is attached on at least a portion of the surface of the hollow particles.

Step (2): The charge-inducible hollow particles obtained in the step (1a) are melt kneaded together with the matrix resin and optionally the conductive substance-free particles, and the kneaded product is formed into a sheet.

Step (3): The sheet obtained in the step (2) is subjected to a polarization treatment in which charges are injected into the sheet.

In the anterior carbonization method, the charge-inducible hollow particles are formed in the step (1a).

When the carbon-containing substance in the surface-treated particles is a hydrocarbon group-containing surfactant, such surface-treated particles may be obtained by, for example, diluting the hydrocarbon group-containing surfactant with an appropriate solvent (for example, methyl alcohol) and soaking the hollow particles into the resultant surfactant solution. In this case, the amount of the surfactant used may be variable depending on the type of the surfactant but is preferably less than 5%, and more preferably about 0.1 to 1.0% relative to the weight of the hollow particles. If the amount of the surfactant exceeds 5% relative to the weight of the hollow particles, the probability is increased that charges may escape from the porous resin sheet. If the amount is less than 0.1%, it is sometimes difficult to form the conductive substance on the surface of the hollow particles.

For example, the heat treatment in the step (1a) may be performed at 250 to 400° C. for 10 to 120 minutes while blocking oxygen. This heat treatment affords the charge-inducible hollow particles probably as a result of the carbonization of at least part (preferably all) of the carbon-containing functional group moieties in the carbon-containing substance and the consequent formation of the conductive substance on at least a portion (preferably the entirety) of the surface of the hollow particles.

Next, in the step (2), the charge-inducible hollow particles obtained in the step (1a) are kneaded together with the matrix resin and optionally the conductive substance-free particles, and the kneaded product is formed into a porous resin sheet. The porous resin sheet can be produced by a known method. When, for example, the matrix resin is a thermoplastic resin, the charge-inducible hollow particles, the matrix resin and optionally the conductive substance-free particles may be melt kneaded in a forming apparatus such as a single-screw or twin-screw extruder, and the kneaded product may be formed into a sheet with an apparatus such as a pressure forming apparatus or a T-die.

The melting temperature is preferably a temperature that is higher than the melting point of the matrix resin by 10 to 50° C. The melting time is preferably 1 to 30 minutes.

The heating temperature during the forming is preferably a temperature that is higher than the melt kneading temperature by 10 to 50° C. and is less than the pyrolysis onset temperature of the matrix resin. The heating time is preferably 10 to 120 minutes.

At the stage of kneading before the sheet production, an elasticity controlling auxiliary (for example, silicone resin fine particles, styrene resin fine particles or acrylic resin fine particles) may be added to cause a change in the elasticity of the matrix resin. In this manner, the sensitivity (=piezoelectric characteristics) of the obtainable porous resin sheets in response to external stress may be optimized.

In the step (3), the sheet obtained in the step (2) is subjected to a polarization treatment in which charges are injected into the sheet. Specifically, the surface of the sheet formed in the step (2) is polarized by a treatment such as corona discharge, thereby injecting charges.

The charges that are injected are probably concentrated at the shells (parts of the conductive substance) of the charge-inducible hollow particles to induce a polarization in the void structures. Part of the induced charges is probably stored at the interface between the charge-inducible hollow particles and the matrix resin.

Upon the application of a compressive load in the sheet thickness direction, the sheet obtained in the step (3) allows extraction of the charges through the front and back surfaces of the sheet. That is, the charges are transferred by external loads (circuitry) to provide an electromotive force.

⟨ Posterior Carbonization Method ⟩

The posterior carbonization method includes:

Step (1b): A portion or the entirety of the surface of the hollow particles is coated with the carbon-containing substance under conditions in which the temperature is about room temperature to 100° C., the treatment time is about 10 minutes to 2 hours and the pressure is normal pressure (the pressure may be reduced or increased as required), thereby obtaining surface-treated particles.

Step (2'): The surface-treated particles obtained in the step (1b) are melt kneaded together with the matrix resin and optionally the conductive substance-free particles. While controlling the temperature as required to a temperature that is from the melting point to less than the decomposition temperature of the matrix resin and is equal to or higher (for example, by 10 to 60° C.) than the melt kneading temperature, the kneaded product is formed into a sheet and the carbon-containing substance is caused to produce conductive properties (as a result of the pyrolysis of the carbon-containing substance). Thus, a sheet is obtained which includes charge-inducible hollow particles containing the conductive substance on at least a portion of the surface of the hollow particles.

Step (3): The sheet obtained in the step (2') is subjected to a polarization treatment in which charges are injected into the sheet.

For example, the step (1b) may be performed by the same process for obtaining the surface-treated particles in the step (1a) described above.

The melt kneading temperature in the step (2') is preferably a temperature that is higher than the melting point of the matrix resin by 10 to 100° C., and more preferably by 10 to 50° C. The melting time is preferably 1 to 30 minutes.

The heating temperature during the forming is preferably a temperature that is higher than the melt kneading temperature by 10 to 50° C. and is less than the pyrolysis onset temperature of the matrix resin. The heating time is preferably 10 to 120 minutes.

Specifically, the carbon-containing substance may attain conductive properties by being heated at a temperature that is less than the pyrolysis onset temperature of the matrix resin, namely, at a temperature of 100 to 350° C., for about 10 minutes to 6 hours under reduced pressure to increased pressure (for example, 0.1 Pa to 10 MPa). These conditions are advantageous in terms of the performance of the obtainable sheets (for example, the initial piezoelectric coefficient is high and the decrease in piezoelectric coefficient with time is small).

The step (2') will be described below in case of using FEP (melting point: 260° C., pyrolysis onset temperature: 400° C.) as an example of the matrix resin. The surface-treated particles and FEP are melt kneaded together (usually at 300 to 310° C. for about 30 minutes) in a forming apparatus such as a single-screw or twin-screw extruder. The resultant kneaded product is formed into a sheet by, for example, a compression forming method with an apparatus such as a pressure forming apparatus or a T-die. During the forming process, the kneaded product is heated at a temperature that is higher (for example, by about 10 to 50° C.) than the melt kneading temperature and is less than the pyrolysis onset temperature of the matrix resin, for example, at a temperature of 350° C. for 10 to 120 minutes and is thereafter pressed into a desired shape at a pressure of 40 to 150 kgf/cm² under air cooling conditions (for example, at normal temperature) or while performing heating.

By performing heating at a temperature of 300 to 350° C. for a prescribed time during the melt kneading (and optionally during the compression forming), at least part (preferably all) of the carbon-containing functional group moieties in the carbon-containing substance covering the surface of the hollow particles will be pyrolyzed and carbonized in the oxygen-blocked atmosphere. This will result in charge-inducible hollow particles which contain the conductive substance attached on the surface of the hollow particles.

The step (3) may be performed as described hereinabove.

⟨ Deposition Method ⟩

The deposition method includes:

Step (1c): A conductive material is deposited onto at least a portion of the surface of the hollow particles to produce charge-inducible hollow particles in which the conductive substance is attached on at least a portion of the surface of the hollow particles.

Step (2): The charge-inducible hollow particles obtained in the step (1c) are kneaded together with the matrix resin and optionally the conductive substance-free particles, and the kneaded product is formed into a sheet.

Step (3): The sheet obtained in the step (2) is subjected to a polarization treatment in which charges are injected into the sheet.

In the step (1c), the charge-inducible hollow particles may be formed by depositing a conductive substance onto at least a portion (preferably the entirety) of the surface of the hollow particles.

Examples of the conductive materials which may be deposited include carbon, graphite, platinum, gold and ITO. These materials may be used singly, or two or more may be used in combination. The deposition technique may be conventional.

The steps (2) and (3) are the same as described hereinabove.

In the step (1c), the conductive material may be attached to the surface of the hollow particles by plating instead of the deposition.

⟨Two-Stage Dispersion Method⟩

Referring to FIG. 3(B), the resin sheet 1 contains uniformly dispersed island structures "a" and "b" (aggregates having a high content of the particles 3 and/or the particles 5, and preferably aggregates having a high content of the particles 3 and the particles 5). Such a resin sheet may be produced in the following manner.

The resin sheet 1 having such a sea-island structure may be produced in the similar manner as any of the anterior carbonization method, the posterior carbonization method and the deposition method, except that the "charge-inducible hollow particles 5" or the "surface-treated particles" used in the step (2) of the anterior carbonization method or the deposition method or in the step (2') of the posterior carbonization method are replaced by "aggregates obtained by kneading the charge-inducible hollow particles 5 or the surface-treated particles with the conductive substance-free particles 3 and a resin having a higher viscosity than the matrix resin 2 (hereinafter, also written as "aggregate-forming resin").

The aggregates are formed beforehand by the use of the aggregate-forming resin. In this manner, the aggregated structures are hard to break even when the aggregates are melt kneaded with the matrix resin 2, and the resin sheet may be obtained while maintaining the target island structures.

To ensure that the resin sheet 1 can store a sufficient amount of charges and achieves an enhancement in piezoelectric coefficient, the island structures present in the resin sheet 1 (namely, the aggregates having a higher content of the particles 3 and/or the particles 5 than the sea structure) preferably have a void rate of 30 to 80 vol %. To ensure that the island structures are appropriately distant from one another and the charges polarized in the island structures are maintained over a long term, the void rate of the sea structure (namely, the structure having a low content of the particles 3 and/or the particles 5) is preferably 0 to 10 vol %.

The volume ratio of the island structures and the sea structure is preferably island structures:sea structure=30-90:10-70, and more preferably 50-80:20-50.

In terms of the initial piezoelectric coefficient and the retention thereof of the obtainable resin sheet as well as the retention of mechanical strength over a long term, the void rate of the resin sheet 1 having the sea-island structure is preferably 10 to 70 vol %, and more preferably 15 to 60 vol %.

The void rates of the sea structure, the island structures, and the resin sheet having the sea-island structure may be calculated using the following equation based on the amounts of the materials used in the sheet production.

$$\text{Void rate}(\%) = ((\text{Volume } A - \text{Volume } B) / \text{Volume } A) \times 100$$

Volume A: Volume calculated from the weights of the materials and the specific gravities (true specific gravities) of the materials.

Volume B: Volume calculated from the weights of the materials and the specific gravities excluding the void structures.

If the void rate of the resin sheet 1 having the sea-island structure is less than 10 vol %, the obtainable resin sheet 1 cannot store a sufficient amount of charges and may fail to ensure a sufficient piezoelectric coefficient for use as a piezoelectric material. If the void rate exceeds 70 vol %, the island structures come to exist substantially close to one another and the formation of the sea-island structure produces small effects, namely, an increase in the retention of piezoelectric characteristics may not be obtained at times.

The size of the island structures (the longer diameter of the large hollow particles) is preferably about 0.1 to 1.0 time the thickness of the sheet.

The aggregate-forming resin is preferably a resin which exhibits a higher viscosity than the matrix resin 2 during kneading and forming. Examples of such resins include those resins mentioned as examples of the matrix resins 2. Of such resins, the aggregate-forming resin is preferably one having a different elastic modulus from the matrix resin.

The use of an aggregate-forming resin having a different elastic modulus from the matrix resin results in a resin sheet that exhibits a nonlinear deformation in response to a compressive strain applied to cause extraction of the charges. Consequently, a small stress can deform the entirety of the resin sheet and thereby a high piezoelectric coefficient may be obtained.

To ensure that the initial piezoelectric coefficient is increased and is retained with a high rate, the difference in elastic modulus between the aggregate-forming resin and the matrix resin is preferably not less than 10 MPa.

The elastic moduli of these resins may be measured by the following method in accordance with JIS K7210.

The raw material resin is formed into a 3 cm×3 cm×2 mm sheet by a known method and is tested on a universal compressive tester ("Technograph TG-50 kN" manufactured by Minebea Co., Ltd.) at a test speed of 5 mm/min. A compressive stress-strain curve is drawn using the measured data, and the elastic modulus may be calculated based on the curve.

From viewpoints such as the heat resistance and the weather resistance of the resin sheets, both the aggregate-forming resin and the matrix resin are more preferably fluororesins or imide resins.

The aggregates may be such that layers of further aggregates are formed on the surface of the aggregates prepared as described above. In the invention, such an aggregate formation method will be described as the "three-stage dispersion method". The three-stage dispersion method is advantageous in that the island structures "a" illustrated in FIG. 3(B) may be formed easily.

(Methods for Producing Piezoelectric Sheets Including Nonwoven Fabrics or Woven Fabrics Formed of Fibers Including Organic Polymers)

A piezoelectric sheet of the invention includes a nonwoven fabric or a woven fabric formed of fibers including an organic polymer. The sheet may be composed of such a nonwoven fabric or woven fabric alone, or may be a stack including additional layers such as known layers disposed on the surface of the nonwoven fabric or the woven fabric.

The nonwoven fabrics or the woven fabrics may be made by producing fibers according to a known method, and depositing the fibers into nonwoven fabrics or weaving the fibers into woven fabrics, followed by forming of the products.

The fibers including an organic polymer may be produced by electrospinning methods, meltspinning methods, meltelectrospinning methods, spunbonding methods (meltblowing methods) and wet methods. Of these, nonwoven fabrics formed of electrospun fibers have a small fiber diameter, a high void rate and a high specific surface area, and the use of piezoelectric sheets including such nonwoven fabrics advantageously realizes piezoelectric stacks exhibiting high piezoelectric characteristics.

The fibers including an organic polymer preferably have an average fiber diameter of 0.05 to 50 µm, more preferably 0.1 to 20 µm, and still more preferably 0.5 µm to 5 µm. This range of average fiber diameter is advantageous in that the piezoelectric sheets including such fibers have a sufficient amount of spaces to store electric charges due to the large surface area of the fibers, and a high uniformity in the distribution of fibers may be obtained even when the sheet is reduced in thickness.

In the case of an electrospinning method, the average fiber diameter of the fibers tends to be reduced by lowering the humidity during electrospinning, reducing the nozzle diameter, applying a higher voltage, or increasing the voltage density.

To determine the average fiber diameter, with respect to (a set of) fibers of interest, a region for scanning electron microscope (SEM) observation is randomly selected, twenty fibers is randomly selected from the region, the fiber diameters (longer diameters) of the twenty fibers are measured with a SEM (magnification: ×10000), and the average fiber diameter is calculated based on the measurement results.

In the fibers, the coefficient of variation of the fiber diameters is preferably not more than 0.7, and more preferably 0.01 to 0.5. With the coefficient of variation of the fiber diameters being in this range, the fibers have a uniform fiber diameter to provide advantages such as that the nonwoven fabrics formed of such fibers have a higher porosity and that the charge retention characteristics of the obtainable porous resin sheets may be enhanced.

The coefficient of variation of the fiber diameters is calculated using the following equation.

Coefficient of variation of fiber diameters=Standard deviation/Average fiber diameter (Electrospinning Methods)

The fibers including an organic polymer may be produced by an electrospinning method. For example, the fibers may be produced by an electrospinning method using a spinning liquid which includes an organic polymer and optionally a solvent.

⟨ Spinning Liquids ⟩

For example, the proportion of the organic polymer in the spinning liquid is 5 to 100 wt %, preferably 5 to 80 wt %, and more preferably 10 to 70 wt %, although variable depending on factors such as the type of the polymer.

The solvent is not particularly limited as long as the organic polymer can be dissolved or dispersed therein. Examples include water, dimethylacetamide, dimethylformamide, tetrahydrofuran, methylpyrrolidone, xylene, acetone, chloroform, ethylbenzene, cyclohexane, benzene, sulfolane, methanol, ethanol, phenol, pyridine, propylene carbonate, acetonitrile, trichloroethane, hexafluoroisopropanol and diethyl ether. These solvents may be used singly, or two or more may be used in combination as a mixed solvent.

For example, the solvent is present in the spinning liquid in a proportion of 0 to 90 wt %, preferably 10 to 90 wt %, and more preferably 25 to 80 wt %.

The spinning liquid may further contain additives such as surfactants, dispersants, charge adjustors, functional particles, adhesives, viscosity modifiers and fiber forming agents. When the organic polymer exhibits low solubility with respect to the solvent (for example, when the organic polymer is polytetrafluoroethylene and the solvent is water), the spinning liquid preferably contains a fiber forming agent in order to retain the organic polymer to form fibers during spinning.

Examples of the surfactants include fluorosurfactants (surfactants containing a fluorine atom, for example, ammonium salts of acids having a perfluoroalkyl group), hydrocarbon surfactants (surfactants having alkyl groups as the main chains) and silicone surfactants (surfactants containing a silicon atom).

Examples of commercial products of the fluorosurfactants include FTERGENT (registered trademark) 100 (anionic fluorosurfactant), FTERGENT (registered trademark) 310 (cationic fluorosurfactant) (both manufactured by NEOS COMPANY LIMITED), MEGAFACE F114 (anionic fluorosurfactant, manufactured by DIC) and SURFLON S-231 (amphoteric fluorosurfactant, manufactured by ASAHI GLASS CO., LTD.).

When the surfactant is used, the amount thereof is, for example, 0.01 to 5 wt %, and preferably 0.1 to 3 wt % in the spinning liquid.

The fiber forming agents are preferably polymers exhibiting high solubility with respect to solvents. Examples include polyethylene oxide, polyethylene glycol, dextran, alginic acid, chitosan, starch, polyvinylpyrrolidone, polyacrylic acid, polymethacrylic acid, polyacrylamide, cellulose and polyvinyl alcohol.

When the fiber forming agent is used, the amount thereof is, for example, 0.1 to 15 wt %, and preferably 1 to 10 wt % in the spinning liquid. However, the amount is variable depending on the viscosity of the solvent and the solubility.

The spinning liquid may be prepared by mixing the organic polymer, the solvent and optionally the additives according to a known method.

A preferred example of the spinning liquids is the following spinning liquid (1).

Spinning liquid (1): A spinning liquid containing polytetrafluoroethylene (PTFE) in 30 to 70 wt %, preferably 35 to 60 wt %, and the fiber forming agent in 0.1 to 10 wt %, preferably 1 to 7 wt %.

The voltage applied during the electrospinning is preferably 1 to 100 kV, more preferably 5 to 50 kV, and still more preferably 10 to 40 kV.

The tip diameter (outer diameter) of the spinning nozzle is preferably 0.1 to 2.0 mm, and more preferably 0.2 to 1.6 mm.

When, for example, the spinning liquid (1) is used, the applied voltage is preferably 10 to 50 kV, more preferably 10 to 40 kV, and the tip diameter (outer diameter) of the spinning nozzle is preferably 0.3 to 1.6 mm.

Specifically, the electrospinning of PTFE fibers will be described as an example of the fiber production. The method for producing PTFE fibers may be any of conventional methods. For example, the following method described in JP-A-2012-515850 may be adopted.

The electrospinning method which may be adopted includes:

a step of providing a spinning liquid including PTFE, a fiber forming agent and a solvent wherein the spinning liquid has a viscosity of at least 50,000 cP;

a step of spinning the spinning liquid through a nozzle to electrically stretch to fiberize;

a step of collecting the fibers onto a collector to form a precursor; and a step of calcining the precursor to remove the solvent and the fiber forming agent thereby forming PTFE fibers.

(Methods for Producing Nonwoven Fabrics of Fibers)

Hereinbelow, steps for forming a nonwoven fabric using the aforementioned fibers will be described.

The production of a nonwoven fabric of the fibers involves a step of producing the fibers and a step of depositing the fibers into a sheet to form a nonwoven fabric. These steps may be performed separately from each other or simultaneously (namely, a nonwoven fabric may be produced by forming the fibers while depositing the fibers into a sheet). Specifically, for example, steps may be performed simultaneously in which the fibers are produced by an electrospinning method while the fibers are deposited into a sheet to produce a nonwoven fabric, or steps may be performed separately in which the fibers are produced and thereafter the resultant fibers are deposited into a sheet by a wet method to form a nonwoven fabric.

Hereinbelow, there will be described the step in which the fibers are deposited into a sheet by a wet method to form a nonwoven fabric.

For example, the wet method for the production of a nonwoven fabric may be such that an aqueous dispersion containing the fibers is poured on a mesh to deposit the fibers thereon, thereby forming a sheet.

The fiber length of the fibers is preferably 0.5 to 100 mm, and preferably 1 to 50 mm.

The amount of the fibers used is preferably 0.1 to 10 wt %, and more preferably 0.1 to 5 wt % relative to the total weight of the aqueous dispersion. This amount of the fibers ensures that efficiently utilizing water in the deposition (papermaking) step and further that the fibers may be dispersed in a good condition to make it possible to obtain a uniform wet nonwoven fabric.

Additives may be added to the aqueous dispersion. Examples of such additives include dispersants including surfactants such as cationic, anionic and nonionic surfactants and lubricants for enhancing the dispersion condition, and anti-foaming agents for suppressing the generation of bubbles.

(Methods for Producing Woven Fabrics of Fibers)

A woven fabric formed of the aforementioned fibers may be produced by any method including a step of producing the fibers and a step of weaving the fibers into a sheet to form a woven fabric.

The fibers may be woven into sheets by conventional weaving methods such as a water jet loom, an air jet loom and a rapier loom.

The basis weight of the nonwoven fabrics and the woven fabrics is preferably not more than 100 g/m$^2$, and more preferably 0.1 to 20 g/m$^2$.

The thickness of the nonwoven fabrics and the woven fabrics is usually 10 μm to 1 mm, and preferably 50 μm to 500 μm.

The basis weight and the thickness tend to be increased by, for example, increasing the spinning time or increasing the number of spinning nozzles.

The porosity of the nonwoven fabrics and the woven fabrics is preferably not less than 60%, and more preferably 80 to 99%. This porosity of the nonwoven fabrics and the woven fabrics is advantageous in that the piezoelectric sheets may store an increased amount of charges.

When, for example, the organic polymer is PTFE, the porosity is calculated as follows.

(True density of PTFE−Apparent density)×100/True density of PTFE

The nonwoven fabrics and the woven fabrics are sheets of the fibers that are deposited or woven. The nonwoven fabrics and the woven fabrics may be composed of a single layer, or may be composed of two or more layers having different materials or fiber diameters.

The piezoelectric sheets of the invention have excellent charge retention properties and can store a large amount of charges, and thus may be used as piezoelectric (electret) devices in various applications. In particular, the piezoelectric sheets can exhibit charge response even to mechanical energy such as oscillation or micro stress and can convert the energy into electrical energy. Thus, the piezoelectric sheets may be suitably used as actuators, sensing materials and power generation materials.

[2. Piezoelectric Sheets Including Nonwoven Fabrics or Woven Fabrics Formed of Fibers Including an Inorganic Material]

A piezoelectric sheet which includes a nonwoven fabric or a woven fabric formed of fibers including an inorganic material has a porosity of not less than 60%, and preferably 80 to 99%. This porosity is advantageous in that the piezoelectric sheets exhibit high flexibility and can store an increased amount of charges.

Examples of the inorganic materials include glasses and ceramics.

The piezoelectric sheets may be obtained by producing fibers of the inorganic materials according to a known method, and depositing the fibers into nonwoven fabrics or weaving the fibers into woven fabrics, followed by forming of the products.

The fibers including an inorganic material may be produced by electrospinning methods, meltspinning methods, meltelectrospinning methods, spunbonding methods (meltblowing methods) and wet methods. Of these, nonwoven fabrics formed of electrospun fibers have a small fiber diameter, a high void rate and a high specific surface area, and the use of piezoelectric sheets including such nonwoven fabrics advantageously realizes piezoelectric stacks exhibiting high flexibility and high piezoelectric characteristics.

The fibers including an inorganic material preferably have an average fiber diameter of 0.05 to 50 μm, more preferably 0.1 to 20 μm, and still more preferably 0.5 μm to 5 μm. This range of average fiber diameter is advantageous in that the piezoelectric sheets including such fibers have a sufficient amount of spaces to store electric charges due to the large surface area of the fibers, and a high uniformity in the distribution of fibers may be obtained even when the sheet is reduced in thickness.

In the fibers, the coefficient of variation of the fiber diameters is preferably not more than 0.7, and more preferably 0.01 to 0.5. With the coefficient of variation of the fiber diameters being in this range, the fibers have a uniform fiber diameter to provide advantages such as that the charge retention characteristics of the obtainable piezoelectric sheets may be enhanced and that the nonwoven fabrics formed of such fibers have a higher porosity.

The basis weight of the nonwoven fabrics and the woven fabrics is preferably not more than 100 g/m$^2$, and more preferably 0.1 to 20 g/m$^2$.

The thickness of the nonwoven fabrics and the woven fabrics is usually 10 μm to 1 mm, and preferably 50 μm to 500 μm.

The piezoelectric sheets of the invention have excellent charge retention properties and can store a large amount of charges, and thus may be used as piezoelectric (electret) devices in various applications.

[3. Surface Coating Layers]

The piezoelectric stack of the invention includes the porous resin sheet or the piezoelectric sheet and a surface coating layer disposed on an exterior surface of the sheet, the exterior surface including at least one of a front surface and a back surface of the porous resin sheet or the piezoelectric sheet. For reasons such as that the piezoelectric stacks can store the charges over a long time and maintain a high piezoelectric coefficient, it is preferable that the surface coating layer cover the front surface and the back surface of the porous resin sheet or the piezoelectric sheet, and more preferably cover the front and back surfaces and end surfaces of the porous resin sheet or the piezoelectric sheet.

In the invention, "the front surface and the back surface of the porous resin sheet or the piezoelectric sheet" refer to the two surfaces having the largest area of the exterior surfaces of the sheet (consisting of six surfaces), and "the end surfaces of the porous resin sheet or the piezoelectric sheet" refer to the four surfaces of the exterior surfaces of the sheet (consisting of six surfaces) excluding the front and back surfaces.

(Volume Resistivity)

The surface coating layer has a volume resistivity of not less than $1 \times 10^{13}$ Ω·cm, and preferably not less than $1 \times 10^{14}$ Ω·cm. This range is advantageous in that the charges in the porous resin sheets or the piezoelectric sheets may be retained over a long term.

The volume resistivity may be measured based on a double-ring electrode method with respect to the surface coating layer itself of interest (as a single film).

(Elastic Modulus)

The elastic modulus of the surface coating layer is not limited as long as its value is different from the elastic modulus of the porous resin sheet or the piezoelectric sheet; that is, the elastic modulus may be higher or lower than the elastic modulus of the porous resin sheet or the piezoelectric sheet. In this case, the difference in elastic modulus between the surface coating layer and the porous resin sheet or the piezoelectric sheet is preferably not less than 10 MPa, and more preferably not less than 50 MPa. This range of difference is advantageous in that the piezoelectric stacks easily exhibit a nonlinear deformation when compressed.

(Relative Dielectric Constant)

The relative dielectric constant of the surface coating layer is preferably 2 to 100.

When the relative dielectric constant is in this range, the injection of charges by corona discharge tends to take place in such a manner that the charges are concentrated inside the surface coating layer having a high dielectric constant and the charges are stored also at the interface between the surface coating layer and the porous resin sheet or the piezoelectric sheet. Further, the charges that are stored are transferred to the void structures in the porous resin sheet or the piezoelectric sheet, and consequently the piezoelectric stack as a whole can store an increased amount of charges and achieves an increase in the initial piezoelectric coefficient.

(Thickness)

The thickness of the surface coating layer is usually not less than 1 μm, and is preferably not more than 30% of the thickness of the porous resin sheet or the piezoelectric sheet. For example, any thickness that is less than 1 μm causes a difficulty when a surface coating film is handled to form the surface coating layer and also causes a possibility of other problems such as the decrease in insulating properties due to defects (pinholes) in the film. If the thickness of the surface coating layer exceeds 30% of the thickness of the porous resin sheet or the piezoelectric sheet, the corona discharge for the injection of charges into the porous resin sheet or the piezoelectric sheet tends to require a higher voltage to make industrial feasibility difficult.

When the surface coating layers are formed on the front surface and the back surface of the porous resin sheet or the piezoelectric sheet, the thicknesses of the surface coating layers are preferably different from each other. Such a piezoelectric stack is apt to be deformed nonlinearly when a compressive strain is applied to the stack, and the stack advantageously tends to exhibit a high piezoelectric coefficient.

(Materials)

The materials for the surface coating layers are not particularly limited as long as layers satisfying the aforementioned properties may be obtained. Thermosetting resins or thermoplastic resins may be used. Examples of the thermosetting resins include polyimides, epoxy resins, thermosetting fluororubbers (such as vinylidene fluoride rubber), polyurethanes, phenolic resins, imide resins (such as polyimide, polyamideimide and bismaleimide) and silicone resins. Examples of the thermoplastic resins include acrylic resins, methacrylic resins, polypropylenes, polyamides, vinyl chloride resins, silicone resins, fluororesins (such as polytetrafluoroethylene (PTFE), polychlorotrifluoroethylene (PCTFE), ethylene-tetrafluoroethylene copolymer (ETFE), polyvinylidene fluoride (PVDF), tetrafluoroethylene-perfluoroalkyl vinyl ether copolymers (PFA), and tetrafluoroethylene-hexafluoropropylene copolymer (FEP)), nylons, polystyrenes, high-density polyethylenes, silicone rubbers, low-density polyethylenes, polyphenylene sulfides, polyethylene oxides, polysulfones and vinylidene chlorides.

(Methods for Forming Surface Coating Layers)

The surface coating layer may be formed by any of known methods. When, for example, a thermosetting resin is used, a solution of the thermosetting resin and a curing agent (a crosslinking agent) in a solvent may be applied to at least one of the front and back surfaces, namely, one or both sides of the porous resin sheet or the piezoelectric sheet, and the wet film(s) may be dried to form the surface coating layer(s). Alternatively, the surface coating layers may be formed by the application and photocuring of photocurable resins.

The curing agent may be any of known curing agents, with examples including 2,5-dimethyl-2,5-di(t-butylperoxy)hexane (trade name: PERHEXA 25B (manufactured by NOF Corporation)) and triallyl isocyanurate (trade name: TAIC (manufactured by NOF Corporation)).

The curing agent is usually used in an amount of 1 to 20 wt %, and preferably 1 to 10 wt % relative to 100 parts by weight of the resin.

Examples of the solvents used herein include tetrahydrofuran (THF), toluene, benzene, acetone and ethylbenzene.

The solvent is usually used in an amount of 100 to 5000 parts by weight, and preferably 200 to 3000 parts by weight per 100 parts by weight of the resin.

Alternatively, the surface coating layers may be formed (stacked) by a method in which the surface coating layers are formed beforehand (in the form of films) and the films are thermocompression bonded with the porous resin sheets or the piezoelectric sheets to produce stacks.

The surface coating layers (formed beforehand in the form of films or sheets) may be obtained by a known forming method. For example, a thermoplastic resin, a thermosetting resin or a photocurable resin may be optionally mixed together with a curing agent and a solvent in a forming apparatus such as a single-screw or twin-screw extruder, and the material may be formed into a sheet or the like with an apparatus such as a pressure forming apparatus or a T-die. In the case of a thermoplastic resin, the forming temperature is usually approximately equal to the melting point of the resin. In the case of a thermosetting resin, the forming temperature is usually approximately equal to the curing temperature of the resin.

[4. Intermediate Layers]

The piezoelectric stack of the invention may have an intermediate layer between the porous resin sheet or the piezoelectric sheet and the surface coating layer.

When the piezoelectric stack of the invention includes two or more porous resin sheets or piezoelectric sheets, an intermediate layer may be disposed between these sheets.

The intermediate layers are preferably layers made of organic materials.

Examples of the organic materials include thermoplastic resins including fluororesins such as tetrafluoroethylene-perfluoroalkyl vinyl ether copolymers [PFA], tetrafluoroethylene-hexafluoropropylene copolymers [FEP], polychlorotrifluoroethylene [PCTFE], tetrafluoroethylene-ethylene copolymers [ETFE], polyvinylidene fluoride [PVdF], polyvinyl fluoride [PVF], tetrafluoroethylene-hexafluoropropylene-vinylidene fluoride copolymers [THV], polytetrafluoroethylene, polyvinylidene fluoride, and ethylene-chlorotrifluoroethylene copolymers [ECTFE]; polyolefin resins such as polypropylene and polyethylene; vinyl polymers such as polystyrene, polymethyl methacrylate, poly(meth)acrylate esters, polyvinyl chloride and polyvinylidene chloride; polyester polymers such as polyethylene terephthalate, polybutylene terephthalate, polyethylene naphthalate, polylactic acid, polyhydroxyalkanoates, polybutylene succinate, polyethylene succinate and polyethylene succinate adipate; polyamides such as 6-nylon, 6,6-nylon, 11-nylon, 12-nylon and aramid; imide resins such as polyimide, polyamideimide, polyetherimide and bismaleimide; and engineering plastics such as polycarbonates and cycloolefins; and further include thermosetting resins such as unsaturated polyesters, vinyl ester resins, diallyl phthalate resins, epoxy resins, polyurethanes, silicon resins, polyimides, alkyd resins, furan resins, cyclopentadiene resins, acrylic resins and allyl carbonate resins. Further, use may be made of other forms of the organic polymers such as foamed products, stretched porous films, nonwoven fabrics, woven fabrics, and gelled or rubbery products.

From the viewpoints of heat resistance and weather resistance, more preferred materials are polyamides such as aramid, polyamideimide, bismaleimide, polytetrafluoroethylene, polyvinylidene fluoride, PFA, FEP, ETFE, PCTFE and ECTFE.

(Elastic Modulus)

The intermediate layer preferably has a different elastic modulus from the porous resin sheet or the piezoelectric sheet and/or from the surface coating layer. That is, the elastic modulus of the layer may be higher or lower than the elastic modulus of the porous resin sheet or the piezoelectric sheet, and/or than the elastic modulus of the surface coating layer. The use of an intermediate layer having an elastic modulus different from that of the porous resin sheet or the piezoelectric sheet and from that of the surface coating layer is advantageous in that the obtainable piezoelectric stack is apt to be deformed nonlinearly when a compressive strain is applied to the stack and thus achieves a high piezoelectric coefficient.

In this case, the difference in elastic modulus between the intermediate layer, and the surface coating layer and/or the porous resin sheet or the piezoelectric sheet is usually not less than 10 MPa, and preferably not less than 50 MPa. This range of difference is advantageous in that the piezoelectric stacks of the invention easily exhibit a nonlinear deformation when compressed.

[5. Piezoelectric Stacks]

For example, the piezoelectric stacks of the invention have a structure in which the surface coating layer is stacked on one of the front and back surfaces of the porous resin sheet (FIG. 7), a structure in which the surface coating layers are stacked on both the front and back surfaces of the porous resin sheet (FIG. 8), a structure in which the surface coating layers are disposed on both the front and back surfaces and on the end surfaces of the porous resin sheet (FIG. 9), a structure in which the intermediate layer is stacked on one side of the porous resin sheet and the surface coating layers are disposed on both the front and back surfaces and on the end surfaces of the stack (FIG. 10), and a structure in which two porous resin sheets are stacked one on top of the other via the intermediate layer and the surface coating layers are disposed on both the front and back surfaces and on the end surfaces of the stack (FIG. 11).

In the piezoelectric stack of the invention, the porous resin sheet or the piezoelectric sheet and the surface coating layer provide a new interface therebetween which can store electric charges, thus achieving an increase in piezoelectric coefficient. Further, the charges that are stored at the interface are transferred to the void structures in the porous resin sheet or the piezoelectric sheet. Consequently, the amount of charges that can be stored is synergistically increased, and a contribution is made to the enhancement in piezoelectric coefficient.

The surface coating layer serves to prevent the decay of charges stored in the porous resin sheet or the piezoelectric sheet by being electrically connected to an exterior environment. In this manner, the surface coating layer effectively functions to maintain the piezoelectric coefficient of the piezoelectric stack of the invention.

By virtue of the difference in elastic modulus between the porous resin sheet or the piezoelectric sheet and the surface coating layer, the piezoelectric stack of the invention is easily deformed nonlinearly when a compressive strain is applied to allow extraction of the charges, and thus can achieve a high piezoelectric coefficient of about 100 to 300 (unit: $d_{33}$ (pC/N)).

Because the piezoelectric stacks of the invention exhibit a charge response even to a small stress and also because the surface sensitivity of charge response to a stress may be adjusted by controlling the structure of the porous resin sheet or the piezoelectric sheet, the piezoelectric stacks of the invention may be used as actuators for use in automobiles, outdoors and even in plants, oscillators, sensing materials such as pressure sensors, oscillation force sensors and press sensors, and power generation materials that use an electromotive force as a power source which is generated by being pressed or oscillated. Further, the electromotive force may be stored in storage mechanisms.

Further, the piezoelectric stacks of the invention have heat resistance, moisture resistance and weather resistance to find use even in severe applications such as high-temperature and high-humidity environments and outdoors in contrast to the conventional piezoelectric materials formed of, for example, PVDF.

EXAMPLES

Next, the present invention will be described in further detail by presenting Examples without limiting the scope of the invention.

[Example 1] Stack Having a Surface Coating Layer on One of the Front and Back Surfaces of a Porous Resin Sheet (Single-Coated Piezoelectric Stack)

⟨Fabrication of Porous Resin Sheet⟩

With 100 g of a fluororesin (FEP, NP101 manufactured by DAIKIN INDUSTRIES, LTD.) (pyrolysis onset temperature: 400° C.; conductivity: $1.0 \times 10^{-16}$ S/cm; MFR: 24 g/10 min (ASTM D2116); melting point: 255° C. (ASTM D2116); apparent density: 1.21 g/ml (JIS K6891)) were mixed 4.3 g of hollow glass beads as hollow particles (60P18 manufactured by Potters-Ballotini Co., Ltd., conductivity: $1.0 \times 10^{-14}$ S/cm). The void rate of the mixture was 10%.

The void rate was calculated as follows.

Void rate(vol %)=((Volume $A$−Volume $B$)/Volume $A$)×100

Volume A: Volume calculated from the weights of the materials and the specific gravities (true specific gravities) of the materials.

Volume B: Volume calculated from the weights of the materials and the specific gravities excluding the void structures of the hollow particles.

The calculation assumed that the specific gravity and the true specific gravity of FEP were 2.1 g/cm$^3$, the true specific gravity of the hollow glass beads was 0.6 g/cm$^3$ (see Sumitomo 3M, Product Catalog "Glass Bubbles—High Performance Additive"), and the specific gravity of the hollow particles excluding the void structures was 2.5 g/cm$^3$.

[Forming Conditions]

The mixture obtained above was formed under the following conditions to give a 3 cm×3 cm×0.3 mm sheet.

The mixture was placed into a 3 cm×3 cm compression forming mold and was heated at 350° C./1 h without the application of pressure. After the heating, the mixture was air cooled to 150° C. while applying a plane pressure of 60 kgf/cm$^2$ to the mixture. Thus, a porous resin sheet was obtained.

⟨Formation of Surface Coating Layer⟩

A solution was provided which contained 10 g of a thermosetting resin (fluororubber DAI-EL G912 manufactured by DAIKIN INDUSTRIES, LTD.) (fluorine concentration: 70.5 wt %, specific gravity (23° C.): 1.91 (JIS K6268), Mooney viscosity (ML1+10·100° C.): about 77 (JIS K6300-1)), and 0.5 g of triallyl isocyanurate (trade name: TALC manufactured by NOF Corporation) and 0.1 g of 2,5-dimethyl-2,5-di(t-butylperoxy) hexane (trade name: PERHEXA 25B manufactured by NOF Corporation) as curing agents in 200 g of a solvent (THF, manufactured by Wako Pure Chemical Industries, Ltd.). The solution was applied to a surface (one of the front and back surfaces) of the porous resin sheet with an applicator and was dried. The film was heated at 160° C. for 15 minutes to perform vulcanization. Consequently, a surface coating layer was formed on one side of the porous resin sheet, the surface coating layer having an elastic modulus lower than that of the sheet. A piezoelectric stack was thus obtained.

The surface coating layer had a volume resistivity of $1.0 \times 10^{13}$ Ω·cm.

The volume resistivity of the surface coating layer was measured based on a double-ring electrode method with respect to a single film of the surface coating layer. The same applies to the volume resistivity of the surface coating layers described hereinafter.

⟨Measurement of Elastic Modulus⟩

The elastic modulus of the porous resin sheet and the surface coating layer was measured with an indentation tester (ENT-2100 manufactured by ELIONIX INC.).

⟨Fabrication of Evaluation Sample⟩

With a corona discharge apparatus manufactured by KASUGA ELECTRIC WORKS LTD., the piezoelectric stack was polarized by being subjected to corona discharge at room temperature for 3 minutes under conditions in which the interelectrode distance was 12.5 mm and the interelectrode voltage was 3 kV. Thereafter, rectangular aluminum foils as electrodes ("FOIL" manufactured by Mitsubishi Aluminum Co., Ltd., 11 μm) were attached to both sides of the stack. An evaluation sample was thus fabricated.

⟨Measurement of Piezoelectric Coefficient⟩

At room temperature (20° C.) and a humidity of 20%, a constant alternate acceleration α (frequency: 90 to 300 Hz, magnitude: 2 to 10 m/s$^2$) was applied in the direction of the thickness of the evaluation sample. The charges generated in response were measured, and the initial piezoelectric coefficient $d_{33}$ (pC/N) was obtained (Day 0). The results are described in Table 1.

[Comparative Example 1] Porous Resin Sheet Used in Example 1

The porous resin sheet fabricated in Example 1 was used alone and the piezoelectric coefficient was measured in the same manner as in Example 1. The results are described in Table 1.

[Example 2] Stack Having Surface Coating Layers on Both the Front and Back Surfaces of a Porous Resin Sheet (Double-Coated Piezoelectric Stack)

⟨Fabrication of Porous Resin Sheet⟩

With 100 g of a fluororesin (FEP, NP-101 manufactured by DAIKIN INDUSTRIES, LTD.) were mixed 18.6 g of hollow glass beads (iM30K manufactured by Sumitomo 3M). The void rate of the mixture was 30%. The void rate was measured in the same manner as in Example 1. The mixture was formed by the same method as in Example 1 to give a 3 cm×3 cm×0.2 mm sheet (a porous resin sheet).

⟨Formation of Surface Coating Layers⟩

Fluororesin sheets (PFA films "AF0025" manufactured by DAIKIN INDUSTRIES, LTD., 25 volume resistivity: $1.0 \times 10^{18}$ Ω·cm) were placed onto both sides (the front and back surfaces) of the porous resin sheet. The sheets were compression bonded together by being held in a hot press at 300° C. and 2 MPa for 180 seconds, thereby forming a stack (a piezoelectric stack). The elastic modulus was measured in the same manner as in Example 1. Further, the stack was tested by the same method as in Example 1 to determine the piezoelectric coefficient. After the initial piezoelectric coefficient was measured, the charged evaluation sample was allowed to stand at room temperature (20° C.) and 20% humidity and the piezoelectric coefficient was measured after the lapse of 1 day and 5 days by the same method as in Example 1. The results are described in Table 1.

[Comparative Example 2] Porous Resin Sheet Used in Example 2

The porous resin sheet fabricated in Example 2 was used alone and the piezoelectric coefficient was measured in the same manner as in Example 2. The results are described in Table 1.

TABLE 1

| | Structure | | | | | | Piezoelectric coefficient $d_{33}$ (pC/N) | | | |
|---|---|---|---|---|---|---|---|---|---|---|
| | Porous resin sheet | | | Surface coating layer | | | | | | |
| | Material | Elastic modulus (MPa) | Thickness (mm) | Material/Configuration | Elastic modulus (MPa) | Thickness (mm) | Day 0 (initial value) | Day 1 | Day 5 | (Remarks) |
| Ex. 1 | Porous FEP | 800 | 0.3 | G912/Single-coated | 50 | 0.05 | 106.6 | — | — | Enhanced initial value |
| Comp. Ex. 1 | Porous FEP | 800 | 0.3 | None | — | — | 19.0 | — | — | |
| Ex. 2 | Porous FEP | 800 | 0.2 | PFA/Double-coated | 450 | 0.05 | 134.9 | 95.1 | 77.2 | Enhanced retention |
| Comp. Ex. 2 | Porous FEP | 800 | 0.2 | None | — | — | 139.6 | 35.4 | 30.6 | |

[Example 3] Stack Having Surface Coating Layers on Both the Front and Back Surfaces of a Porous Resin Sheet Including a PTFE Nonwoven Fabric (Double-Coated PTFE Nonwoven Fabric Piezoelectric Stack)

⟨Fabrication of Porous Resin Sheet⟩

Polytetrafluoroethylene (PTFE) fibers were deposited into a sheet by an electrospinning method described in JP-A-2012-515850, thereby producing a porous resin sheet composed of a PTFE nonwoven fabric with a thickness of 60 μm (porosity 80%, elastic modulus 6 MPa).

⟨Measurement of Porosity⟩

The porosity was measured by the following method.

The porous resin sheet was cut into a 4 cm square (4 cm in length, 4 cm in width) test piece. The apparent density was calculated using the weight of the test piece and the thickness measured with a micrometer (LITEMATIC VL-50 manufactured by Mitutoyo Corporation). The porosity was calculated based on the following relation.

(True density of PTFE−Apparent density)×100/True density of PTFE

⟨Measurement of Average Fiber Diameter and Standard Deviation of Fiber Diameters⟩

To determine the average fiber diameter, a region of the porous resin sheet for SEM observation was randomly selected and was observed with a SEM (apparatus: S-3400 (manufactured by Hitachi High-Technologies Corporation), magnification: ×10000) to measure the fiber diameters of randomly selected twenty fibers. Based on the measurement results, the (arithmetic) average fiber diameter, the standard deviation of the fiber diameters, and the coefficient of variation of the fiber diameters were calculated. The average fiber diameter was 1.3 μm, the standard deviation of the fiber diameters was 0.4, and the coefficient of variation of the fiber diameters was 0.3.

The coefficient of variation of the fiber diameters was calculated using the following equation.

Coefficient of variation of fiber diameters=Standard deviation of fiber diameters/Average fiber diameter ⟨Formation of Surface Coating Layers⟩

A piezoelectric stack was produced in the same manner as in Example 2, except that the PTFE nonwoven fabric obtained above was used as the porous resin sheet and PFA films manufactured by DAIKIN INDUSTRIES, LTD. ("AF0012", 12.5 μm, volume resistivity: $1.0 \times 10^{18}$ Ω·cm) were used as the fluororesin sheets for surface coating layers. The elastic modulus was measured in the same manner as in Example 1. Further, the stack was tested by the same method as in Example 1 to determine the piezoelectric coefficient. After the initial piezoelectric coefficient was measured, the charged evaluation sample was allowed to stand at room temperature (20° C.) and 20% humidity and the piezoelectric coefficient was measured after the lapse of 1 day and 5 days by the same method as in Example 1. The results are described in Table 2.

[Example 4] Stack Having Surface Coating Layers on Both the Front and Back Surfaces and on End Surfaces of a Porous Resin Sheet Including a PTFE Nonwoven Fabric (Double-Coated and End-Coated PTFE Nonwoven Fabric Piezoelectric Stack)

⟨Fabrication of Porous Resin Sheet⟩

The procedures of Example 3 were repeated to produce a porous resin sheet including a PTFE nonwoven fabric (porosity 80%, thickness 0.06 mm, elastic modulus 6 MPa, average fiber diameter 1.3 μm, standard deviation of fiber diameters 0.4, coefficient of variation of fiber diameters 0.3).

⟨Formation of Surface Coating Layers⟩

Surface coating layers were formed on both the front and back surfaces of the porous resin sheet in the same manner as in Example 3. Subsequently, an end surface-coating material was prepared by adding 2 parts by weight of 2,5-dimethyl-2,5-di(t-butylperoxy)hexane (trade name: PERHEXA 25B (manufactured by NOF Corporation)) and 5 parts by weight of triallyl isocyanurate (trade name: TAIC (manufactured by NOF Corporation)) to a solution of 100 parts by weight of a fluororubber (DAI-EL G912 manufactured by DAIKIN INDUSTRIES, LTD.) in 1000 parts by weight of toluene. The coating material was applied to the four end surfaces of the stack of the porous resin sheet with the surface coating layers, and was thermally cured at 150° C. for 15 minutes to form an end-coating layer. A piezoelectric stack was thus obtained. The volume resistivity of the end-coating layer was $1.0 \times 10^{13}$ Ω·cm.

The elastic modulus was measured in the same manner as in Example 1. Further, the stack was tested by the same method as in Example 1 to determine the piezoelectric coefficient. After the initial piezoelectric coefficient was measured, the charged evaluation sample was allowed to stand at room temperature (20° C.) and 20% humidity and the piezoelectric coefficient was measured after the lapse of 1 day and 5 days by the same method as in Example 1. The results are described in Table 2.

TABLE 2

| | Structure | | | | | Piezoelectric coefficient $d_{33}$ (pC/N) | | |
|---|---|---|---|---|---|---|---|---|
| | Porous resin sheet | | Surface coating layer | | | | | |
| | Material | Elastic modulus (MPa) | Thickness (mm) | Material/Configuration | Elastic modulus (MPa) | Thickness (mm) | Day 0 (initial value) | Day 1 | Day 5 |
| Ex. 3 | PTFE nonwoven fabric | 6 | 0.06 | PFA/Double-coated | 450 | 0.0125 | 93.8 | 61.3 | 50.3 |
| Ex. 4 | PTFE nonwoven fabric | 6 | 0.06 | PFA/Double-coated/End-coated | 450 | 0.0125 | 142.5 | 118.5 | 88.0 |

Reference Example 1

(Production of Porous Resin Sheet)

As hollow particles, 3M™ Glass Bubbles "iM30K" manufactured by Sumitomo 3M (composition: soda lime borosilicate glass, 50% particle diameter: 16 μm, amount of glass (calculated value): 24 (vol %), conductivity: $1.0 \times 10^{-13}$ S/cm) were provided. The surface of the hollow particles was coated with 1 wt % to the weight of the hollow particles of a nonionic surfactant (Nonion ID-206 manufactured by NOF CORPORATION; polyoxyethylene isodecyl ether, pyrolysis onset temperature: 150° C.). Specifically, the hollow particles were coated by being soaked in the prescribed amount of the surfactant diluted 50 times with methyl alcohol. The coating of the nonionic surfactant on the surface of the hollow particles was confirmed by SEM.

18.6 g of the surfactant-coated hollow particles were melt kneaded with 100 g of FEP (NEOFLON™ FEP "NP-101" manufactured by DAIKIN INDUSTRIES, LTD.; pyrolysis onset temperature: 400° C.; conductivity: $1.0 \times 10^{-16}$ S/cm; MFR: 24 g/10 min (ASTM D2116); melting point: 255° C. (ASTM D2116); apparent density: 1.21 g/ml (JIS K6891)) at 300 to 310° C. for 30 minutes. The kneaded product was compression formed (heated at 350° C. for 40 minutes and thereafter pressed at 60 kgf/cm² for 600 seconds while being air cooled) into a sheet. A sample sheet with a thickness of 0.5 mm was thus obtained.

The void rate of the sample sheet was 30 vol %.

The surfactant attached to the surface of the hollow particles was assumed to have been partially or completely carbonized during the sheet production step, resulting in a conductive substance with a conductivity of $1.0 \times 10^{-10}$ S/cm.

The conductivity of the conductive substance on the surface of the hollow particles was measured as follows. The surfactant was applied onto a glass substrate to form a coating layer, which was then heated at 300° C. for a prescribed time under reduced pressure (an oxygen-blocked environment). The resultant carbonized layer was analyzed based on a double-ring electrode method with a resistivity meter (Digital Super Megohmmeter DSM-8104 (manufactured by HIOKI E.E. CORPORATION)).

With a corona discharge apparatus manufactured by KASUGA ELECTRIC WORKS LTD., the sample sheet was polarized by being subjected to corona discharge at room temperature for 3 minutes under conditions in which the interelectrode distance was 12.5 mm and the interelectrode voltage was 3 kV. A porous resin sheet was thus produced.

(Evaluation of Piezoelectric Performance of Porous Resin Sheet)

Rectangular aluminum foils as electrodes ("FOIL" manufactured by Mitsubishi Aluminum Co., Ltd.; thickness: 11 μm) were attached to both sides of the porous resin sheet (3 cm×3 cm×0.5 mm thickness). An evaluation sample was thus fabricated.

At room temperature (20° C.) and a humidity of 20%, a constant alternate acceleration α (frequency: 90 to 300 Hz, magnitude: 2 to 10 m/s²) was applied in the direction of the thickness of the evaluation sample. The charges generated in response were measured, and the initial piezoelectric coefficient $d_{33}$ (pC/N) was obtained (Day 0).

Thereafter, the charged evaluation sample was allowed to stand at room temperature (20° C.) and 20% humidity and the piezoelectric coefficient $d_{33}$ was measured after the lapse of 2, 3, 5, 10, 11, 20 and 27 days by the same method.

The results are described in Table 3 and FIG. 5. All the data are average values (n=3).

Reference Example 2

A porous resin sheet was produced in the same manner as in Reference Example 1, except that the amount of the nonionic surfactant relative to the weight of the hollow particles in Reference Example 1 was changed to 0.5 wt %. The piezoelectric performance was evaluated in the same manner as in Reference Example 1, the results being described in Table 3 and FIG. 5.

Comparative Example 3

A porous resin sheet was produced in the same manner as in Reference Example 1, except that the amount of the nonionic surfactant relative to the weight of the hollow particles in Reference Example 1 was changed to 0 wt % (namely, the hollow particles were not coated with the surfactant). The piezoelectric performance was evaluated in the same manner as in Reference Example 1, the results being described in Table 3 and FIG. 5.

TABLE 3

| | | Comp. Ex. 3 | Ref. Ex. 1 | Ref. Ex. 2 |
|---|---|---|---|---|
| Surfactant | | None | Nonion ID-206 1 wt % | Nonion ID-206 0.5 wt % |
| $d_{33}$ (pC/N) | Day 0 | 155 | 125 | 138 |
| | After 2 days | — | 68 | — |
| | After 3 days | 29 | — | 96 |
| | After 5 days | — | — | 68 |
| | After 10 days | 25 | 67 | — |
| | After 11 days | — | 62 | — |
| | After 27 days | — | 50 | — |

As apparent from Table 3, the porous resin sheets produced in Reference Examples maintained a $d_{33}$ value of above 60 pC/N even after the lapse of 5 days and were demonstrated to have a high ability to retain piezoelectric characteristics compared to the porous resin sheet of Comparative Example 3 which contained the hollow particles without any attachment of a conductive substance to the surface.

Example 5

(Evaluation of Heat Resistance Characteristics of Piezoelectric Stack)

The piezoelectric stack of Example 2 that had been tested after the lapse of 5 days was heat treated by being allowed to stand in an electric furnace at 80° C. for 100 hours. Thereafter, the sample was removed from the electric furnace and was air cooled to room temperature. The piezoelectric characteristics were evaluated in the same manner as in Example 1 (the measurement is equivalent to after 9 days measurement after the date of production). As a result, the heat-treated porous resin sheet had $d_{33}$ of 61 pC/N and was found to maintain substantially the equal level of characteristics to before the heat treatment. It has been then demonstrated that the porous resin sheets for piezoelectric devices of the present invention have heat resistance that prevents the deactivation of piezoelectric characteristics even when the sheets are exposed to a high-temperature environment such as at 80° C.

Reference Example 3

⟨Preparation of Island Structure-Forming Pellets⟩

As hollow particles, use was made of hollow glass beads (60P18, manufactured by Potters-Ballotini Co., Ltd., conductivity: $1.0 \times 10^{-14}$ S/cm) (composition: borosilicate glass, particle diameter: 16 μm, true specific gravity: 0.6 g/cm$^3$, specific gravity assuming solid particles: 2.5 g/cm$^3$, amount of glass (calculated value): 24 (vol %)). The surface of the hollow particles was coated with 1 wt % to the weight (100 wt %) of the hollow particles of a nonionic surfactant (Nonion ID-206 manufactured by NOF CORPORATION; pyrolysis onset temperature: 150° C.). Specifically, the hollow particles were coated by being soaked in the prescribed amount of the surfactant diluted 50 times with methyl alcohol at normal temperature and normal pressure. The nonionic surfactant (Nonion ID-206) contained no solvent.

16.5 g of the surfactant-coated hollow particles were kneaded with 30 g of PFA (NEOFLON™ PFA "AP-230" manufactured by DAIKIN INDUSTRIES, LTD.; MFR: 2.0 g/10 min (ASTM D2116); viscosity at 300° C.: $1.0 \times 10^6$ poise; melting point: 306° C. (ASTM D2116); apparent density: 1.21 g/ml (JIS K6891); pyrolysis onset temperature: 400° C.; specific gravity: 2.1 g/cm$^3$) using a kneader (Labo Plastomill (4C150-01 manufactured by TOYO SEIKI SEI-SAKU-SHO, LTD.)) at 310° C. for 10 minutes. The kneaded product was crushed to give island structure-forming pellets having a void rate of 50 vol %.

⟨Preparation of Sea/Island Structure-Forming Pellets⟩

With Labo Plastomill, 29.0 g of NEOFLON FEP (model: NP101 manufactured by DAIKIN INDUSTRIES, LTD.; specific gravity: 2.1 g/cm$^3$; conductivity: $1.0 \times 10^{-15}$ S/cm; MFR: 24 g/10 min (in accordance with ASTM D2116); viscosity at 300° C.: $1.0 \times 10^4$ poise; melting point: 255° C. (in accordance with ASTM D2116); apparent density: 1.21 g/ml (in accordance with JIS K6891)) as a sea structure was kneaded at 300° C. for 5 minutes. Further, 23.0 g of the island structure-forming pellets as island structures were added, and the mixture was kneaded at 300° C. for 10 minutes to give sea/island structure-forming pellets.

The percentages of the sea structure and the island structures were sea structure:island structures=40 vol %:60 vol %. The void rate of the sea/island structure-forming pellets as a whole was 30 vol %.

The percentages of the sea structure and the island structures were calculated based on the weights and the densities of the respective materials, and the amount of glass of the hollow particles.

⟨Formation of Sample Sheet⟩

The sea/island structure-forming pellets as a raw material were molded to form a 3 cm×3 cm×0.2 mm sample sheet.

Specifically, the sea/island structure-forming pellets were placed in a mold, heated at 350° C. for 1 hour, and pressed at 3 MPa while performing air cooling to give the sample sheet.

Consequently, the surfactant attached to the surface of the hollow particles was converted into a conductive substance having a conductivity of $1.0 \times 10^{-10}$ S/cm.

The conductivity was measured as follows. The surfactant was applied onto a glass substrate to form a coating layer, which was then heated at 300° C. for a prescribed time under reduced pressure (an oxygen-blocked environment). The resultant carbonized layer was analyzed based on a double-ring electrode method with a resistivity meter (Digital Super Megohmmeter DSM-8104 (manufactured by HIOKI E.E. CORPORATION)).

⟨Fabrication of Evaluation Sample⟩

With a corona discharge apparatus manufactured by KASUGA ELECTRIC WORKS LTD., the sample sheet was polarized by being subjected to corona discharge at room temperature for 3 minutes under conditions in which the interelectrode distance was 12.5 mm and the interelectrode voltage was 3 kV, thereby producing a porous resin sheet. Thereafter, rectangular aluminum foils as electrodes ("FOIL" manufactured by Mitsubishi Aluminum Co., Ltd., 11 μm) were attached to both sides of the sheet. An evaluation sample sheet was thus fabricated.

⟨Evaluation of Piezoelectric Coefficient⟩

At room temperature (20° C.) and a humidity of 20%, a constant alternate acceleration α (frequency: 90 to 300 Hz, magnitude: 2 to 10 m/s$^2$) was applied in the direction of the thickness of the evaluation sample sheet. The charges generated in response were measured, and the initial piezoelectric coefficient $d_{33}$ (pC/N) was obtained (Day 0).

Thereafter, the charged evaluation sheet was allowed to stand at room temperature (20° C.) and 20% humidity and the piezoelectric coefficient $d_{33}$ was measured after the lapse of 1, 5 and 22 days by the same method.

The results are described in Table 4.

TABLE 4

| | | Ref. Ex. 3 |
|---|---|---|
| Sea-island structure | | ○ |
| Piezoelectric coefficient $d_{33}$ (pC/N) | Day 0 | 134 |
| | After 1 days | 92 |
| | After 2 days | — |
| | After 5 days | 69 |
| | After 11 days | — |
| | After 22 days | 66 |
| | After 27 days | — |

[Example 6] Stack Having Surface Coating Layers on Both the Front and Back Surfaces and on End Surfaces of a Porous Resin Sheet Including a PTFE Nonwoven Fabric (Double-Coated and End-Coated Wet PTFE Nonwoven Fabric Piezoelectric Stack)

A PTFE nonwoven fabric with a thickness of 125 μm (a PTFE nonwoven fabric 1, elastic modulus 10 MPa) was produced by a wet papermaking method described in JP-A-H03-97993. A piezoelectric stack was produced and the piezoelectric coefficient was measured in the same manner as in Example 4, except that the PTFE nonwoven fabric 1 was used as the porous resin sheet. The results are described in Table 5.

The piezoelectric characteristic retention rates on Day 5 of the piezoelectric stacks obtained in Examples 6 to 10 are values calculated by "Piezoelectric coefficient on Day 5×100/Initial value".

[Example 7] Stack Having Surface Coating Layers on Both the Front and Back Surfaces and on End Surfaces of a Porous Resin Sheet Including a PTFE Nonwoven Fabric (Double-Coated and End-Coated Wet PTFE Nonwoven Fabric Piezoelectric Stack)

A PTFE nonwoven fabric with a thickness of 300 µm (a PTFE nonwoven fabric 1', elastic modulus 12 MPa) was produced by a wet papermaking method described in JP-A-H03-97993. A piezoelectric stack was produced and the piezoelectric coefficient was measured in the same manner as in Example 4, except that the PTFE nonwoven fabric 1' was used as the porous resin sheet. The results are described in Table 5.

[Example 8] Stack Having Surface Coating Layers on Both the Front and Back Surfaces and on End Surfaces of a Porous Resin Sheet Including a PTFE Nonwoven Fabric (Double-Coated and End-Coated Electrospun PTFE Nonwoven Fabric Piezoelectric Stack)

PTFE fibers were deposited into a sheet by an electrospinning method described in JP-A-2012-515850, thereby producing a PTFE nonwoven fabric with a thickness of 50 µm (elastic modulus 6 MPa) (a PTFE nonwoven fabric 2). A piezoelectric stack was produced and the piezoelectric coefficient was measured in the same manner as in Example 4, except that the PTFE nonwoven fabric 2 was used as the porous resin sheet. The results are described in Table 5.

[Example 9] Stack Having Surface Coating Layers on Both the Front and Back Surfaces and on End Surfaces of a Porous Resin Sheet Including a PTFE Nonwoven Fabric (Double-Coated and End-Coated Electrospun PTFE Nonwoven Fabric Piezoelectric Stack)

PTFE fibers were deposited into a sheet by an electrospinning method described in JP-A-2012-515850, thereby producing a PTFE nonwoven fabric with a thickness of 100 µm (elastic modulus 6 MPa) (a PTFE nonwoven fabric 2').

A piezoelectric stack was produced and the piezoelectric coefficient was measured in the same manner as in Example 4, except that the PTFE nonwoven fabric 2' was used as the porous resin sheet. The results are described in Table 5.

[Example 10] Stack Having Surface Coating Layers on Both the Front and Back Surfaces and on End Surfaces of a Porous Resin Sheet Including a Stretched PTFE Film (Double-Coated and End-Coated Stretched PTFE Porous Film Piezoelectric Stack)

A piezoelectric stack was produced and the piezoelectric characteristics were evaluated in the same manner as in Example 4, except that a stretched PTFE film (porosity 78%, average pore diameter 0.30 µm, thickness 50 µm, elastic modulus 4 MPa) was used as the porous resin sheet. The results are described in Table 5.

The average fiber diameters, the standard deviations of the fiber diameters, the coefficients of variation of the fiber diameters and the porosities of the porous resin sheets used in Examples 6 to 10 were measured in the same manner as in Example 3. The results are described in Table 5.

⟨Evaluation of Charge Response to Stress⟩

The piezoelectric stacks produced in Example 6 and Example 9 were tested by the following technique to evaluate the charge response to a stress.

The piezoelectric stacks produced in Example 6 and Example 9 were cut into 3 cm squares. With a corona discharge apparatus manufactured by KASUGA ELECTRIC WORKS LTD., the samples were polarized by being subjected to corona discharge at room temperature for 3 minutes under conditions in which the interelectrode distance was 12.5 mm and the interelectrode voltage was 3 kV. Thereafter, the samples were deformed by the application of a compressive stress (1 mm/min head speed) with a load cell in the direction of the thickness of the stack at room temperature (20° C.) and 20% humidity. The charges (pC/cm$^2$) on the surface of the stack generated in response to the stress (N/cm$^2$) were measured with use of a charge amplifier. The results are illustrated in FIG. 12.

The results show that the piezoelectric stacks of the invention generate charges in response to even a small stress and the manner in which the charges are generated in response to a stress is varied depending on the structure of the piezoelectric sheet. The piezoelectric stack produced in Example 9 exhibits a sharp rise in the amount of charges generated in response to a stress and thus may be suitably used as a highly sensitive sensing material. On the other hand, the piezoelectric stack produced in Example 6 exhibits a large change in the amount of charges at a stress of 0.1 N/cm$^2$ or below and thus may be suitably used as a highly sensitive sensing material in a microstress application.

TABLE 5

| | | Structure of resin sheet | | | | | Piezoelectric characteristics | | | |
| | | Thickness of | Fiber diameters | | | | $d_{33}$ (pC/N) | | | |
| | Type of resin sheet | resin sheet (mm) | Average (µm) | Standard deviation | Coefficient of variation | Porosity (%) | Initial value | Day 1 | Day 5 | Retention on Day 5 |
|---|---|---|---|---|---|---|---|---|---|---|
| Ex. 6 | PTFE nonwoven fabric 1 | 0.1 | 19 | 2.9 | 0.2 | 66% | 290 | 260 | 240 | 83% |
| Ex. 7 | PTFE nonwoven fabric 1' | 0.3 | 19 | 2.9 | 0.2 | 63% | 250 | 250 | 220 | 88% |
| Ex. 8 | PTFE nonwoven fabric 2 | 0.05 | 1.3 | 0.4 | 0.3 | 89% | 280 | 250 | 140 | 50% |
| Ex. 9 | PTFE nonwoven fabric 2' | 0.1 | 1.3 | 0.4 | 0.3 | 89% | 260 | 180 | 150 | 58% |

TABLE 5-continued

| | | Structure of resin sheet | | | | | Piezoelectric characteristics | | | |
|---|---|---|---|---|---|---|---|---|---|---|
| | | Thickness of | Fiber diameters | | | | $d_{33}$ (pC/N) | | | |
| | Type of resin sheet | resin sheet (mm) | Average (μm) | Standard deviation | Coefficient of variation | Porosity (%) | Initial value | Day 1 | Day 5 | Retention on Day 5 |
| Ex. 10 | Stretched PTFE | 0.05 | 0.2 | 0.2 | 1.0 | 78% | 270 | 200 | 90 | 33% |

⟨High-Temperature High-Humidity Durability Test⟩

The piezoelectric stack produced in Example 8 was subjected to the following high-temperature high-humidity durability test.

The piezoelectric stack produced in Example 8 was stored under room-temperature dry conditions (25° C., 25% RH) or high-temperature high-humidity conditions (85° C., 85% RH) for 200 hours. The piezoelectric coefficient was measured by the same method as in Example 1, the results being described in Table 6.

TABLE 6

| Test method | Storage conditions | Piezoelectric characteristics $d_{33}$ (pC/N) after storage |
|---|---|---|
| Storage under high temperature and high humidity conditions | 85° C./85% RH/200 h | 155 |
| Storage under room temperature and dry conditions | RT/25% RH/200 h | 185 |

The results indicate that the piezoelectric stacks of the invention can maintain high piezoelectric characteristics even when exposed to a high-temperature and high-humidity environment.

[Example 11] Stack Having Surface Coating Layers on Both the Front and Back Surfaces and on End Surfaces of a Porous Resin Sheet Including a Glass Nonwoven Fabric (Double-Coated and End-Coated Glass Nonwoven Fabric Piezoelectric Stack)

A piezoelectric stack was produced and the piezoelectric characteristics were evaluated in the same manner as in Example 4, except that a glass nonwoven fabric (glass fiber filter paper GA-55 manufactured by Toyo Roshi Kaisha, Ltd., thickness 0.25 mm, porosity 90%, elastic modulus 110 MPa) was used as the porous resin sheet. The results are described in Table 7.

The porosity of the porous resin sheet used in Example 11 was measured with respect to a test piece that had been cut out from the sheet. Specifically, the sample density was determined based on the size and the weight measured with respect to the test piece, and the porosity was calculated using the following equation. The calculation assumed the density of the solid glass to be 2.4 g/cm³.

$$\text{Porosity} = (1-(\text{Sample density/Solid glass density})) \times 100(\%)$$

TABLE 7

| | | Structure of resin sheet | | | | | Piezoelectric characteristics | | | |
|---|---|---|---|---|---|---|---|---|---|---|
| | | Thickness of | Fiber diameters | | | | $d_{33}$ (pC/N) | | | |
| | Type of resin sheet | resin sheet (mm) | Average (μm) | Standard deviation | Coefficient of variation | Porosity (%) | Initial value | Day 1 | Day 5 | Retention on Day 5 |
| Ex. 11 | Glass nonwoven fabric | 0.25 | 0.9 | 0.4 | 0.5 | 90% | 250 | 160 | 130 | 57% |

REFERENCE SIGNS LIST

1 . . . POROUS RESIN SHEET (STRUCTURE UNCHANGED BETWEEN BEFORE AND AFTER POLARIZATION TREATMENT IN STEP (3))
2 . . . MATRIX RESIN
3 . . . HOLLOW PARTICLE
4 . . . CONDUCTIVE SUBSTANCE
5 . . . CHARGE-INDUCIBLE HOLLOW PARTICLE
6 . . . PIEZOELECTRIC STACK
7 . . . POROUS RESIN SHEET
8 . . . SURFACE COATING LAYER
9 . . . INTERMEDIATE LAYER

The invention claimed is:

1. A piezoelectric stack comprising:
a piezoelectric sheet comprising a nonwoven fabric or a woven fabric formed of fibers comprising an organic polymer, and
a surface coating layer disposed on an exterior surface of the piezoelectric sheet, the exterior surface including at least one of a front surface and a back surface of the piezoelectric sheet,
the surface coating layer having a volume resistivity of not less than $1 \times 10^{13}$ Ω·cm, the piezoelectric sheet and the surface coating layer having different elastic moduli,
wherein the nonwoven fabric and the woven fabric are other than a stretched porous film,
wherein a coefficient of variation of the diameters of the fibers is not more than 0.7, and
wherein an average fiber diameter of the fibers is 0.05 to 1.3 μm.

2. The piezoelectric stack according to claim 1, wherein the difference in elastic modulus between the piezoelectric sheet and the surface coating layer is not less than 10 MPa.

3. The piezoelectric stack according to claim 1, wherein the surface coating layer has a relative dielectric constant of 2 to 100.

4. The piezoelectric stack according to claim 1, wherein the surface coating layer covers the front and back surfaces and end surfaces of the piezoelectric sheet.

5. The piezoelectric stack according to claim 1, wherein the piezoelectric sheet has a porosity of not less than 60%.

6. The piezoelectric stack according to claim 1, wherein the organic polymer is an organic polymer free from a molecular dipole or a crystal dipole.

7. The piezoelectric stack according to claim 1, wherein the organic polymer is polytetrafluoroethylene.

8. A piezoelectric stack comprising:

a piezoelectric sheet comprising a nonwoven fabric or a woven fabric formed of fibers comprising an inorganic material, the piezoelectric sheet having a porosity of not less than 60%, wherein the nonwoven fabric and the woven fabric are other than a stretched porous film, and wherein an average fiber diameter of the fibers is 0.05 to 0.9 μm, and a surface coating layer disposed on an exterior surface of the piezoelectric sheet, the exterior surface including at least one of a front surface and a back surface of the piezoelectric sheet, the surface coating layer having a volume resistivity of not less than $1 \times 10^{13}$ Ω·cm, the piezoelectric sheet and the surface coating layer having different elastic moduli.

9. The piezoelectric stack according to claim 8, wherein the surface coating layer is disposed on the front and back surfaces and end surfaces of the piezoelectric sheet.

* * * * *